United States Patent
You et al.

(10) Patent No.: US 12,477,817 B2
(45) Date of Patent: Nov. 18, 2025

(54) SEMICONDUCTOR DEVICE

(71) Applicant: Samsung Electronics Co., Ltd., Suwon-si (KR)

(72) Inventors: Jung Gun You, Ansan-si (KR); Sug Hyun Sung, Yongin-si (KR); Chan Kyo Park, Seoul (KR); Seung Chul Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 551 days.

(21) Appl. No.: 17/957,654

(22) Filed: Sep. 30, 2022

(65) Prior Publication Data
US 2023/0187439 A1 Jun. 15, 2023

(30) Foreign Application Priority Data
Dec. 14, 2021 (KR) .......................... 10-2021-0178913

(51) Int. Cl.
| H01L 27/088 | (2006.01) |
| H01L 29/06 | (2006.01) |
| H01L 29/423 | (2006.01) |
| H01L 29/786 | (2006.01) |
| H10D 30/67 | (2025.01) |
| H10D 62/10 | (2025.01) |
| H10D 84/83 | (2025.01) |

(52) U.S. Cl.
CPC ......... *H10D 84/83* (2025.01); *H10D 30/6735* (2025.01); *H10D 30/6757* (2025.01); *H10D 62/121* (2025.01)

(58) Field of Classification Search
CPC ............... H10D 84/83; H10D 30/6735; H10D 30/6757; H10D 62/121; H10D 30/014; H10D 30/43; H10D 64/693; H10D 64/689; H10D 84/0181; H10D 84/0188; H10D 84/038; H10D 84/85; H10D 84/0177; H10D 84/853; H10D 84/80; H10D 88/00; B82Y 10/00; H10B 10/12
USPC .......................................................... 257/401
See application file for complete search history.

(56) References Cited

U.S. PATENT DOCUMENTS

| 7,390,568 B2 | 6/2008 | Kim et al. |
| 8,039,847 B2 | 10/2011 | Nuzzo et al. |
| 9,076,537 B2 | 7/2015 | Khvalkovskiy et al. |
| 9,768,305 B2 | 9/2017 | Ko et al. |

(Continued)

OTHER PUBLICATIONS

European Search Reported dated Aug. 18, 2023 for corresponding application No. EP 22 199 526.9.
(Continued)

*Primary Examiner* — Tong-Ho Kim
(74) *Attorney, Agent, or Firm* — Muir Patent Law, PLLC

(57) ABSTRACT

There is provided a semiconductor device capable of improving the performance and reliability of a device. The semiconductor device comprising, a first active pattern on a substrate, the first active pattern including a first lower pattern, which extends in a first direction, and first sheet patterns, which are on the first lower pattern, a second active pattern on the substrate, the second active pattern including a second lower pattern, which is spaced apart from the first lower pattern in a second direction and a second sheet patterns, which are on the second lower pattern, wherein the first lower pattern and the second lower pattern is separated by a fin trench.

20 Claims, 16 Drawing Sheets

(56) References Cited

U.S. PATENT DOCUMENTS

| | | |
|---|---|---|
| 9,960,077 B1 | 5/2018 | Zang et al. |
| 9,997,463 B2 | 6/2018 | Zhang |
| 10,510,620 B1 | 12/2019 | Chanemougame et al. |
| 10,832,916 B1 | 11/2020 | Xie et al. |
| 10,896,957 B2 | 1/2021 | Cho et al. |
| 10,950,610 B2 | 3/2021 | Paul et al. |
| 11,133,311 B2 | 9/2021 | Bhuwalka et al. |
| 2020/0035786 A1 | 1/2020 | Xie et al. |
| 2020/0091145 A1* | 3/2020 | Guha .................. H10D 84/834 |
| 2020/0266192 A1 | 8/2020 | Ju et al. |
| 2020/0373402 A1 | 11/2020 | Yang et al. |
| 2021/0020644 A1 | 1/2021 | Paul et al. |
| 2022/0328496 A1* | 10/2022 | Kang .................. H10D 62/121 |

OTHER PUBLICATIONS

First Office Action dated Aug. 30, 2023 for corresponding application No. EP 22 199 526.9.

* cited by examiner

SEMICONDUCTOR DEVICE

CROSS-REFERENCE TO RELATED APPLICATION

This application claims priority to Korean Patent Application No. 10-2021-0178913 filed on Dec. 14, 2021 in the Korean Intellectual Property Office and all the benefits accruing therefrom under 35 U.S.C. 119, the contents of which in their entirety are herein incorporated by reference.

BACKGROUND

1. Technical Field

The present disclosure relates to a semiconductor device, and particularly, to a semiconductor device including a Multi-Bridge Channel Field Effect Transistor (MBCFET™).

2. Description of the Related Art

As a scaling technique for increasing the density of a semiconductor device, a multi-gate transistor has been suggested in which a fin-type or nanowire-type multi-channel active pattern (or silicon body) is formed on a substrate and a gate is formed on the surface of the multi-channel active pattern.

Since the multi-gate transistor uses a three-dimensional (3D) channel, scaling can be facilitated. Also, current control capability can be improved without increasing the length of the gate of the multi-gate transistor. Also, a short channel effect (SCE), i.e., the phenomenon of the potential of a channel region being affected by a drain voltage, can be effectively suppressed.

SUMMARY

Aspects of the present disclosure provide a semiconductor device capable of improving performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a first active pattern on a substrate, the first active pattern including a first lower pattern, which extends in a first direction, and first sheet patterns, which are on the first lower pattern, a second active pattern on the substrate, the second active pattern including a second lower pattern, which is spaced apart from the first lower pattern in a second direction and a second sheet patterns, which are on the second lower pattern, wherein the first lower pattern and the second lower pattern is separated by a fin trench, a field insulating film disposed between the first and second lower patterns, the field insulating film being in contact with the first and second lower patterns, a first gate structure on the substrate, the first gate structure intersecting the first active pattern, a second gate structure on the substrate, the second gate structure intersecting the second active pattern and a gate separation pattern disposed on the field insulating film, the gate separation pattern being in contact with the first gate structure and second gate structure, wherein the first gate structure includes a first terminal region, which is disposed between the first active pattern and the gate separation pattern, the second gate structure includes a second terminal region, which is disposed between the second active pattern and the gate separation pattern, a distance between the gate separation pattern and the first sheet patterns is less than a distance between the gate separation pattern and the second sheet patterns, and a first height from a vertical level of a bottom surface of the fin trench to a lowermost part of the first terminal region is greater than a second height from the vertical level of the bottom surface of the fin trench to a lowermost part of the second terminal region.

According to another aspect of the present disclosure, there is provided a semiconductor device comprising a first active pattern on a substrate, the first active pattern including a first lower pattern, which extends in a first direction, and first sheet patterns, which are on the first lower pattern, a second active pattern on the substrate, the second active pattern including a second lower pattern, which is spaced apart from the first lower pattern in a second direction, and second sheet patterns, which are on the second lower pattern, a field insulating film disposed between the first lower pattern and the second lower pattern, the field insulating film being in contact with the first lower pattern and the second lower pattern, a first gate structure on the substrate, the first gate structure intersecting the first active pattern, a second gate structure on the substrate, the second gate structure intersecting the second active pattern, a gate separation pattern disposed on the field insulating film, the gate separation pattern including a first sidewall, which faces the first sheet patterns, and a second sidewall, which faces the second sheet patterns and a first separation sidewall pattern disposed on a portion of the first sidewall of the gate separation pattern, wherein an upper surface of the first separation sidewall pattern is lower than an upper surface of the first sheet patterns.

According to still another aspect of the present disclosure, there is provided a semiconductor device comprising a first active pattern on a substrate, the first active pattern including a first lower pattern extending in a first direction and first sheet patterns on the first lower pattern, a second active pattern on the substrate, the second active pattern including a second lower pattern spaced apart from the first lower pattern in a second direction, and second sheet patterns on the second lower pattern, a field insulating film disposed between the first lower pattern and the second lower pattern, the field insulating film being in contact with the first lower pattern and the second lower pattern, a first gate structure on the substrate, the first gate structure intersecting the first active pattern and including a first gate insulating film and a first gate electrode, a second gate structure on the substrate, the second gate structure intersecting the second active pattern and including a second gate insulating film and a second gate electrode, and a gate separation structure disposed on the field insulating film, the gate separation structure being in contact with the first sheet patterns and the second sheet patterns, wherein the gate separation structure includes a lower part, which is disposed below an upper surface of the first sheet patterns, and an upper part, which is disposed above the upper surface of the first sheet patterns, the first gate structure and the second gate structure are in contact with sidewalls of the upper part of the gate separation structure, the first gate insulating film and the second gate insulating film extend along the sidewalls of the upper part of the gate separation structure, and a distance, in the second direction, between the upper part of the gate separation structure and the first sheet patterns is less than a distance, in the second direction, between the upper part of the gate separation structure and the second sheet patterns.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Semiconductor devices according to some embodiments of the present disclosure may include a tunneling field-effect transistor (FET), a three-dimensional (3D) transistor, a two-dimensional (2D) material-based FET, and a heterostructure thereof. Also, semiconductor devices according to some embodiments of the present disclosure may include a bipolar junction transistor, and a laterally-diffused metal-oxide semiconductor (LDMOS) transistor.

A semiconductor device according to some embodiments of the present disclosure will hereinafter be described with reference to FIGS. 1 through 4.

Figure 1:
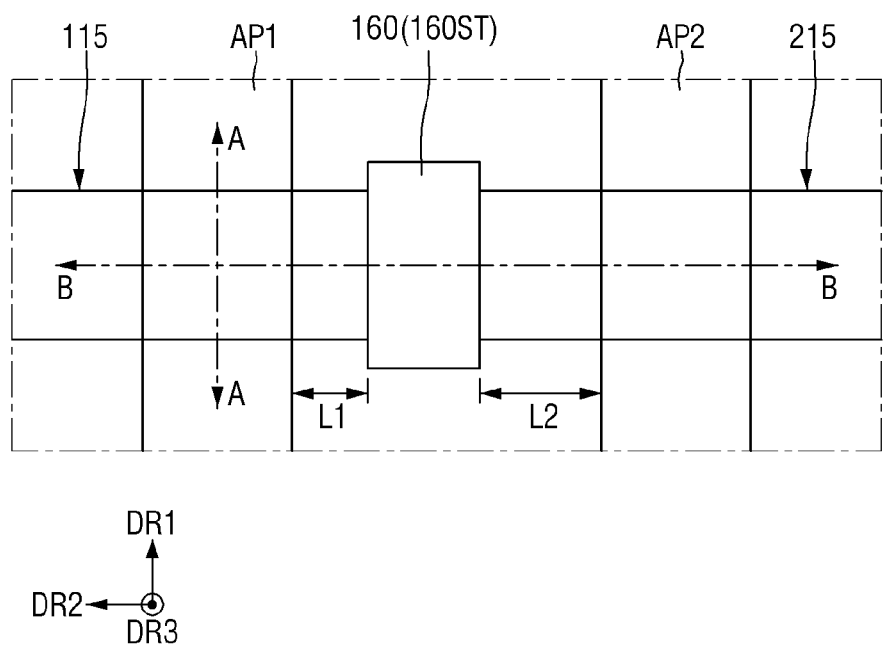
FIG. 1 is an exemplary layout view of a semiconductor device according to some embodiments of the present disclosure.
Figure 2:
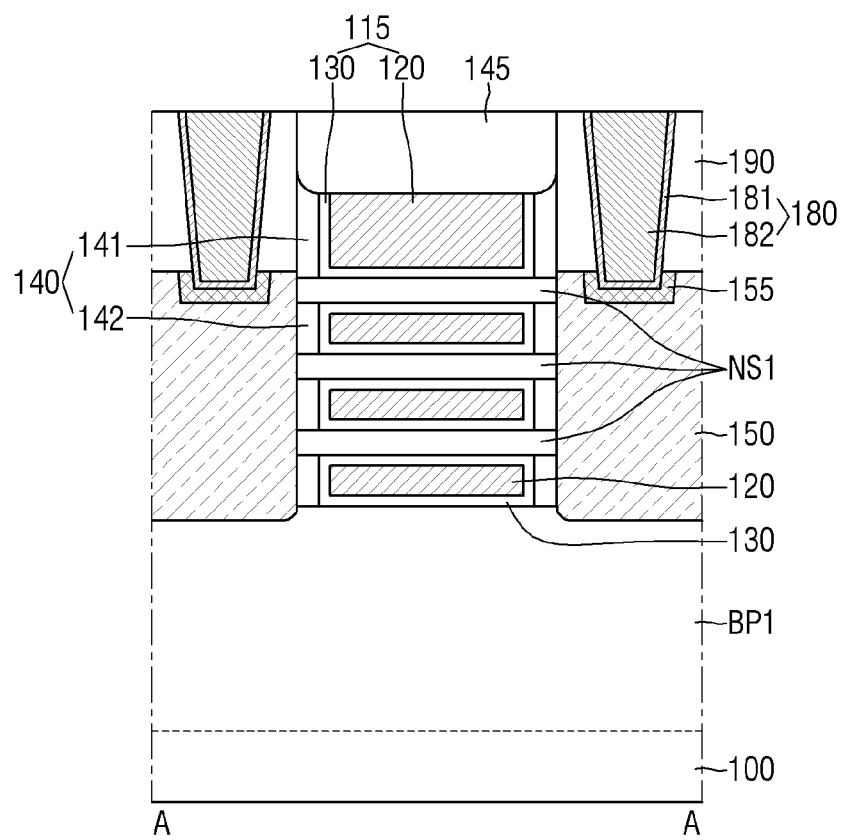
FIGS. 2 and 3 are exemplary cross-sectional views taken along line A-A of FIG. 1.
Figure 2:
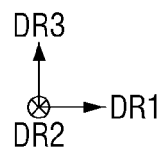
Figure 3:
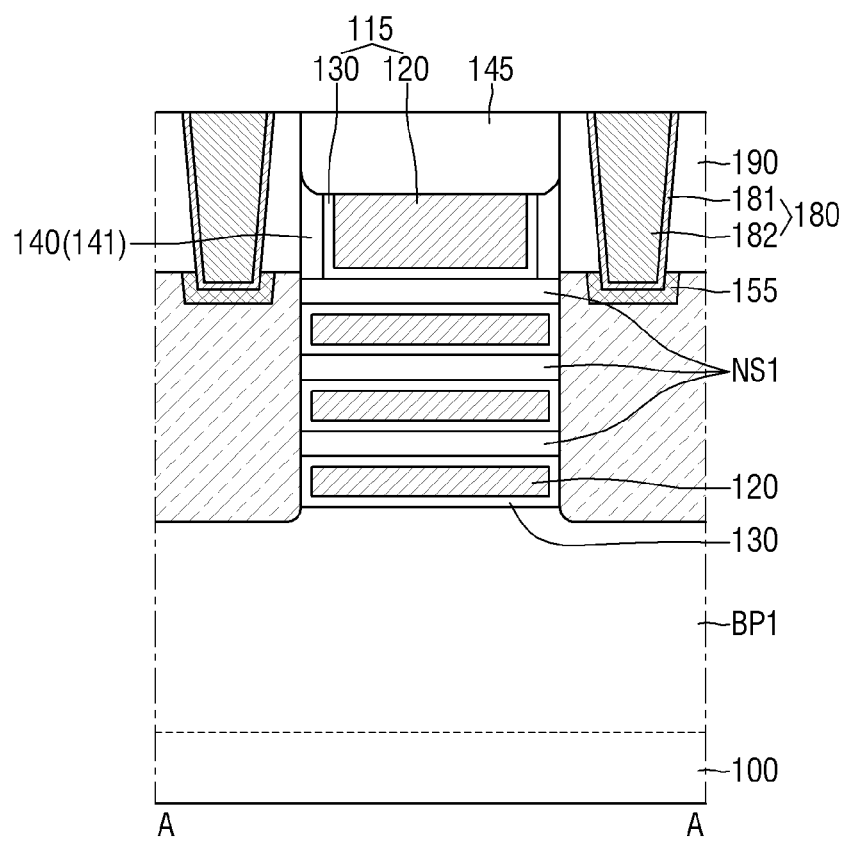
Figure 3:
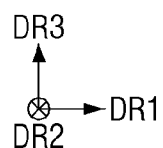
Figure 4:
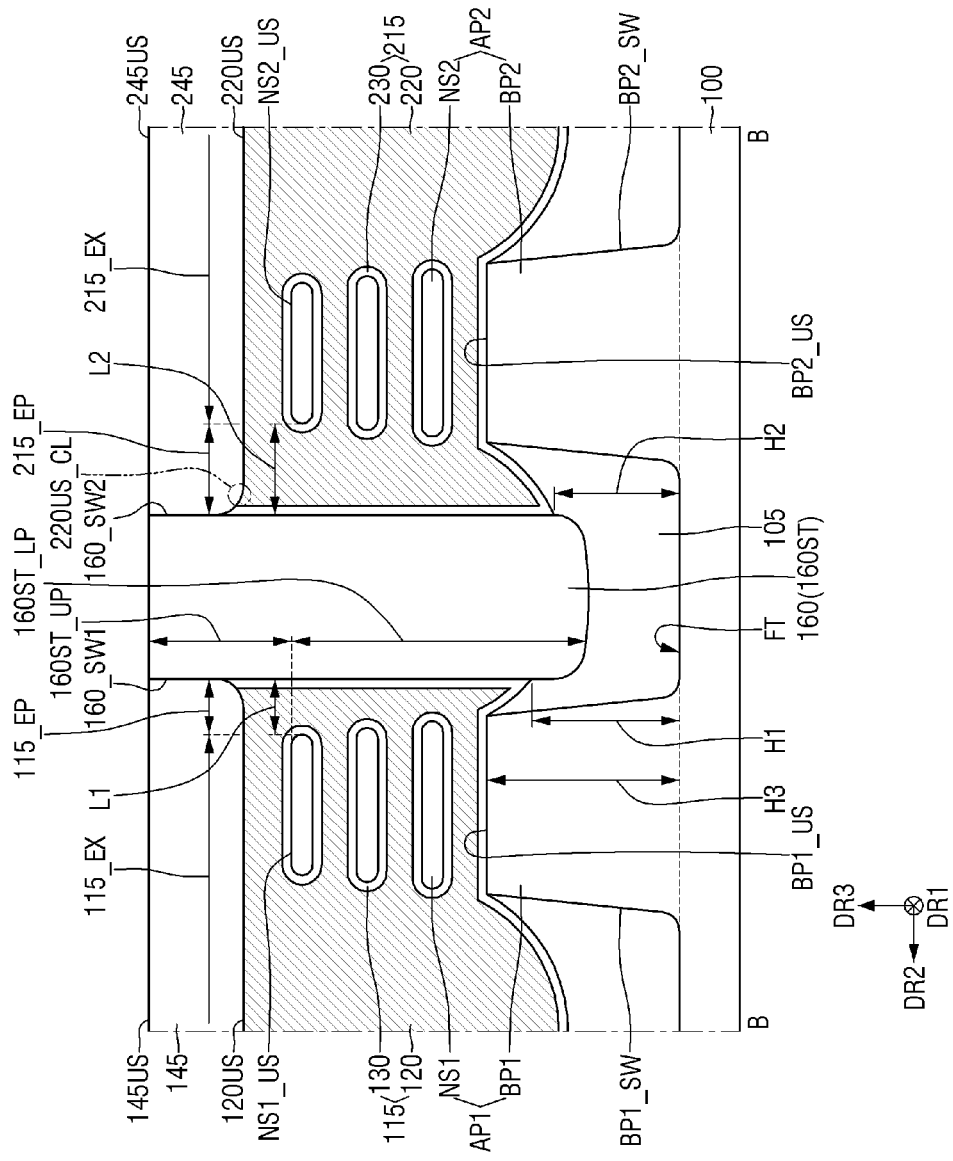
FIG. 4 is an exemplary cross-sectional view taken along line B-B of FIG. 1.

FIG. 1 is an exemplary layout view of a semiconductor device according to some embodiments of the present disclosure. FIGS. 2 and 3 are exemplary cross-sectional views taken along line A-A of FIG. 1. FIG. 4 is an exemplary cross-sectional view taken along line B-B of FIG. 1.

Referring to FIGS. 1 through 4, the semiconductor device according to some embodiments of the present disclosure may include a first active pattern AP1, a second active pattern AP2, a first gate structure 115, a second gate structure 215, and a gate separation structure 160ST formed on a substrate 100.

The substrate 100 may be a bulk silicon substrate or a silicon-on-insulator (SOI) substrate. Alternatively, the substrate 100 may be a silicon substrate or a silicon germanium-on-insulator (SGOI) and/or may include another material such as, for example, silicon germanium (SiGe), indium antimonide, a lead tellurium compound, indium arsenide, indium phosphide, gallium arsenide, or gallium antimonide, but the present disclosure is not limited thereto.

The first active pattern AP1 and the second active pattern AP2 may be disposed on the substrate 100. The first active pattern AP1 and the second active pattern AP2 may extend in a first direction DR1. The first active pattern AP1 and the second active pattern AP2 may be adjacent to each other in a second direction DR2. The first active pattern AP1 and the second active pattern AP2 may be disposed to be spaced apart from each other in the second direction DR2. For example, the first direction DR1 may be orthogonal to the second direction DR2.

For example, one of the first active pattern AP1 and the second active pattern AP2 may be a region where a P-type metal-oxide semiconductor (PMOS) is formed, and the other active pattern may be a region where an N-type metal-oxide semiconductor (NMOS) is formed. One of the first active pattern AP1 and the second active pattern AP2 may include the channel region of a PMOS, and the other active pattern may include the channel region of an NMOS. In another example, each of the first active pattern AP1 and the second active pattern AP2 may be a region where a PMOS is formed. In yet another example, each of the first active pattern AP1 and the second active pattern AP2 may be a region where an NMOS is formed.

For example, the first active pattern AP1 and the second active pattern AP2 may be active regions included in a static random-access memory (SRAM) region. In another example, the first active pattern AP1 and the second active pattern AP2 may be active regions included in a logic area.

The first active pattern AP1 may include a first lower pattern BP1 and a plurality of first sheet patterns NS1. The second active pattern AP2 may include a second lower pattern BP2 and a plurality of second sheet patterns NS2.

Each of the first lower pattern BP1 and second lower pattern BP2 may protrude from the substrate 100. Each of the first lower pattern BP1 and second lower pattern BP2 may extend in the first direction DR1. Each of the first lower pattern BP1 and second lower pattern BP2 may have a fin-type pattern shape.

The first lower pattern BP1 may be spaced apart from the second pattern BP2 in the second direction DR2. The first lower pattern BP1 and second lower pattern BP2 may be separated by a fin trench FT, which extends in the first direction DR1.

A plurality of the first sheet patterns NS1 may be disposed on the first lower pattern BP1. A plurality of the first sheet patterns NS1 may be spaced apart from the first lower pattern BP1 in a third direction DR3.

A plurality of the second sheet patterns NS2 may be disposed on the second lower pattern BP2. A plurality of the second sheet patterns NS2 may be spaced apart from the second lower pattern BP2 in the third direction D3.

The first sheet patterns NS1 may be sequentially arranged in the third direction DR3. Each of the first sheet patterns NS1 may be spaced apart from the other first sheet patterns NS1 in the third direction DR3. The second sheet patterns NS2 may be sequentially arranged in the third direction DR3. Each of the second sheet patterns NS2 may be spaced apart from the other second sheet patterns NS2 in the third direction DR3. Here, the third direction DR3 may be orthogonal to the first direction DR1 and second direction DR2. For example, the third direction DR3 may be the thickness direction of the substrate 100.

Each of the first sheet patterns NS1 may include an upper surface. In the description that follows, an upper surface NS1_US may be the upper surface of the uppermost first sheet pattern NS1. Also, the upper surface NS1_US may be the upper surface of the first active pattern AP1. Similarly, an upper surface NS2_US may be the upper surface of the uppermost second sheet pattern NS2.

Spatially relative terms, such as "beneath," "below," "lower," "above," "upper" and the like, may be used herein for ease of description to describe positional relationships. It will be understood that the spatially relative terms encompass different orientations of the device in addition to the orientation depicted in the figures.

FIGS. 2 and 3 illustrate that three first sheet patterns NS1 are arranged in the third direction DR3 and three second sheet patterns NS2 are arranged in the third direction D3, but the present disclosure is not limited thereto.

Each of the first lower pattern BP1 and second lower pattern BP2 may be obtained by etching part of the substrate 100 and may include an epitaxial layer grown from the substrate 100. Each of the first lower pattern BP1 and second lower pattern BP2 may include silicon (Si) or germanium (Ge), which is an element semiconductor material. In certain embodiments, each of the first lower pattern BP1 and second lower pattern BP2 may include a compound semiconductor such as, for example, a group IV-IV compound semiconductor or a group III-V compound semiconductor.

The group IV-IV compound semiconductor may be, for example, a binary or ternary compound containing at least two of, Si, Ge, and tin (Sn) or a compound obtained by doping the binary or ternary compound with a group IV element.

The group III-V compound semiconductor may be, for example, a binary, ternary, or quaternary compound obtained by combining at least one of aluminum (Al), gallium (Ga), and indium (In), which are group III elements, and one of phosphorus (P), arsenic (As), and antimony (Sb), which are group V elements.

The first sheet patterns NS1 may include one of an element semiconductor material (e.g., Si or Ge), the group IV-IV compound semiconductor, and the group III-V compound semiconductor. The second sheet patterns NS2 may include one of an element semiconductor material (e.g., Si or Ge), the group IV-IV compound semiconductor, and the group III-V compound semiconductor.

The width, in the second direction DR2, of the first sheet patterns NS1 may increase or decrease in proportion to the width, in the second direction DR2, of the first lower pattern BP1. The width, in the second direction DR2, of the second sheet patterns NS2 may increase or decrease in proportion to the width, in the second direction DR2, of the second lower pattern BP2.

A field insulating film 105 may be formed on the substrate 100. The field insulating film 105 may fill at least part of the fin trench FT.

The field insulating film 105 may be disposed on the substrate 100, between the first active pattern AP1 and second active pattern AP2. The field insulating film 105 may be in contact with the first active pattern AP1 and second active pattern AP2.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The field insulating film 105 may be in contact with the first active pattern AP1 and second active pattern AP2, which means that there is no active pattern for use as the channel region of a transistor between the first active pattern AP1 and second active pattern AP2.

The field insulating film 105 may be disposed between the first lower pattern BP1 and second lower pattern BP2. The field insulating film 105 may be in contact with the first lower pattern BP1 and second lower pattern BP2.

For example, the field insulating film 105 may generally cover sidewalls BP1_SW of the first lower pattern BP1 and the sidewalls BP2_SW of the second lower pattern BP2 that define the fin trench FT. The field insulating film 105 may not cover an upper surface of the first lower pattern BP1_US and an upper surface of the second lower pattern BP2_US. For example, the field insulating film 105 may expose a top surface of the first lower pattern BP1_US and a top surface of the second lower pattern BP2_US.

Each of the first sheet patterns NS1 and the second sheet patterns NS2 may be located higher than an upper surface (e.g., the uppermost/top surface) of the field insulating film 105. The field insulating film 105 may include or may be, for example, an oxide film, a nitride film, an oxynitride film, or a combination thereof.

The first gate structure 115 may be disposed on the substrate 100. The first gate structure 115 may be disposed on the field insulating film 105. The first gate structure 115 may be disposed on the first active pattern AP1 and may intersect the first active pattern AP1.

The first gate structure 115 may be disposed on the first lower pattern BP1. The first gate structure 115 may intersect the first lower pattern BP1. The first gate structure 115 may surround the first sheet patterns NS1.

When one first sheet pattern NS1 among the plurality of first sheet patterns NS1 is described as an example, "The first gate structure 115 may surround the first sheet patterns NS1" means the first gate structure 115 may surround the entire circumferences of the first sheet patterns NS1, e.g., in a cross-sectional view, as illustrated in FIG. 4.

The second gate structure 215 may be disposed on the substrate 100. The second gate structure 215 may be disposed on the field insulating film 105. The second gate structure 215 may be disposed on the second active pattern AP2 and may intersect the second active pattern AP2.

The second gate structure 215 may be disposed on the second lower pattern BP2. The second gate structure 215 may intersect the second lower pattern BP2. The second gate structure 215 may surround the second sheet patterns NS2.

The first gate structure 115 may include a first gate electrode 120 and first gate insulating films 130. The second gate structure 215 may include a second gate electrode 220 and second gate insulating films 230.

The first gate insulating films 130 may be disposed on the first active pattern AP1. The first gate insulating films 130 may extend along and/or contact the upper surface of the field insulating film 105 and the upper surface BP1_US of the first lower pattern BP1.

The first gate insulating films 130 may be disposed on the first sheet patterns NS1 respectively. The first gate insulating films 130 may surround the first sheet patterns NS1 respectively. The first gate insulating films 130 may be disposed along the entire circumferences of the first sheet patterns NS1, e.g. in a cross-sectional view.

The second gate insulating films 230 may be disposed on the second active pattern AP2. The second gate insulating films 230 may extend along and/or contact the upper surface of the field insulating film 105 and the upper surface BP2_US of the second lower pattern BP2.

The second gate insulating films 230 may be disposed on the sheet patterns NS2 respectively. The second gate insulating films 230 may surround the second sheet patterns NS2 respectively. The second gate insulating films 230 may be disposed along the entire circumferences of the second sheet patterns NS2, e.g., in a cross-sectional view.

The first gate insulating films 130 and the second gate insulating films 230 may include or be formed of silicon oxide, silicon oxynitride, silicon nitride, or a high-k material having a greater dielectric constant than silicon oxide. The high-k material may include or may be, for example, one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

FIGS. 2 through 4 illustrate that the first gate insulating films 130 and the second gate insulating films 230 are single-layer films, but the present disclosure is not limited thereto. For example, each of the first gate insulating films 130 may be a multilayer film including an interfacial film and a high-k insulating film on the interfacial film, and each of the second gate insulating films 230 may be a multilayer film including an interfacial film and a high-k insulating film on the interfacial film.

The semiconductor device according to some embodiments of the present disclosure may include negative capacitance (NC) FETs using negative capacitors. For example, the first gate insulating films 130 and the second gate insulating films 230 may include ferroelectric material films having ferroelectric properties and paraelectric material films having paraelectric properties.

The ferroelectric material films may have negative capacitance, and the paraelectric material films may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having negative capacitance and the paraelectric material films having positive capacitance are connected in series, the total capacitance of the ferroelectric material films and the paraelectric material films may increase. Accordingly, transistors having the ferroelectric material films can have a sub-threshold swing (SS) of less than 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material films.

If the ferroelectric material films include hafnium oxide, the dopant of the ferroelectric material films may include, for example, at least one of Gd, Si, Zr, Al, and Y.

If the dopant of the ferroelectric material films is Al, the ferroelectric material films may include 3 atomic % (at %) to 8 at % of Al. Here, the ratio of the dopant in the ferroelectric material films may be the ratio of the sum of the amounts of Hf and Al to the amount of Al in the ferroelectric material films.

If the dopant of the ferroelectric material films is Si, the ferroelectric material films may include 2 at % to 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may include, for example, at least one of silicon oxide and a high-k metal oxide. The high-k metal oxide may include, for example, at least one of hafnium oxide, zirconium oxide, and aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, each of the first gate insulating films 130 and the second gate insulating films 230 may include one ferroelectric material film. In another example, each of the first gate insulating films 130 and the second gate insulating films 230 may include a plurality of ferroelectric material films that are spaced apart from one another. Each of the first gate insulating films 130 and the second gate insulating films 230 may have a structure in which a plurality of ferroelectric material films and a plurality of paraelectric material films are alternately stacked.

The first gate electrode 120 is disposed on the first active pattern AP1. The first gate electrode 120 is disposed on the first gate insulating films 130.

The first gate electrode 120 may surround the first sheet patterns NS1. The first gate electrode 120 may surround the entire circumferences of the first sheet patterns NS1, e.g., in a cross-sectional view.

The second gate electrode 220 is disposed on the second active pattern AP2. The second gate electrode 220 is disposed on the second gate insulating films 230.

The second gate electrode 220 may surround the second sheet patterns NS2. The second gate electrode 220 may surround the entire circumferences of the second sheet patterns NS2, e.g., in a cross-sectional view.

The first gate electrode 120 and second gate electrode 220 include at least one of a metal, a metal alloy, a conductive metal nitride, a metal silicide, a doped semiconductor material, a conductive metal oxide, and a conductive metal oxynitride. Each of the first and second gate electrodes 120 and 220 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), Al, copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present disclosure is not limited thereto. Here, the conductive metal oxide and the conductive metal oxynitride may include oxides of the aforementioned materials, but the present disclosure is not limited thereto.

Source/drain patterns 150 may be disposed on the first lower pattern BP1. The source/drain patterns 150 may be disposed on at least one side of the first gate structure 115. The source/drain patterns 150 may be connected (e.g., directly connected) to the first sheet patterns NS1.

The source/drain patterns 150 may be included in or may be the source/drain of a transistor using the first sheet patterns NS1 as a channel region.

Although not specifically illustrated, source/drain patterns connected (e.g., directly connected) to the second sheet patterns NS2 may be disposed on the second lower pattern BP2.

Gate spacers 140 may be disposed on sidewalls of the first gate structure 115. The gate spacers 140 may extend in the second direction DR2. The gate spacers 140 may be disposed on the first lower pattern BP1.

Referring to FIG. 2, the gate spacers 140 may include outer spacers 141 and inner spacers 142. The inner spacers 142 may be disposed between the first sheet patterns NS1, which are adjacent to one another in the third direction DR3. For example, the inner spacers 142 may vertically overlap the first sheet patterns NS1. Parts of the first gate structure 115 between the first sheet patterns NS1 may not be in contact with the source/drain patterns 150. The parts of the first gate structure 115 between the first sheet patterns NS1 may be in contact with the inner spacers 142. For example, the inner spacers 142 may be disposed between the first gate structure 115 and the source/drain patterns 150. For example, the inner spacers 142 may overlap the first gate structure 115 and the source/drain patterns 150 in the first direction DR1 (a horizontal direction).

Referring to FIG. 3, the gate spacers 140 may not include the inner spacers 142 and may include only the outer spacers 141. The parts of the first gate structure 115 between the first sheet patterns NS1 may be in contact with the source/drain patterns 150.

The outer spacers 141 and the inner spacers 142 may include, for example, at least one of silicon nitride (SiN), silicon oxynitride (SiON), silicon oxide (SiO$_2$), silicon oxycarbide (SiOCN), silicon boron nitride (SiBN), silicon oxyboron nitride (SiOBN), silicon oxycarbide (SiOC), and a combination thereof.

Although not specifically illustrated, the second active pattern AP2 may have a cross-sectional view the same as or similar to that illustrated in FIG. 2 or 3, along the first direction DR1 (e.g., in a plane perpendicular to the second direction DR2).

A first gate capping pattern 145 may be disposed on the first gate structure 115. The first gate capping patterns 145 may extend along and/or contact an upper surface 120US of the first gate electrode 120.

A second gate capping pattern 245 may be disposed on the second gate structure 215. The second gate capping pattern 245 may extend along and/or contact an upper surface 220US of the second gate electrode 220.

The first gate capping pattern 145 may be disposed on the gate spacers 140. An upper surface 145US of the first gate capping pattern 145 may be placed on the same plane as an upper surface of interlayer insulating films 190. Alternatively, the first gate capping pattern 145 may be disposed between the gate spacers 140. For example, the first gate capping pattern 145 may horizontally overlap the gate spacers 140.

The first gate capping pattern 145 and the second gate capping pattern 245 may include or be formed of, for example, at least one of silicon nitride, silicon oxynitride, silicon carbonitride (SiCN), SiOCN, and a combination thereof. The first gate capping pattern 145 and the second gate capping pattern 245 may include or be formed of a material having etch selectivity with respect to the interlayer insulating films 190.

The gate separation structure 160ST is disposed between the first gate structure 115 and the second gate structure 215. The gate separation structure 160ST is disposed on the field insulating film 105.

The gate separation structure 160ST separates and electrically insulates the first gate structure 115 and the second gate structure 215 from each other. The gate separation structure 160ST is in contact with the first gate structure 115 and the second gate structure 215.

The gate separation structure 160ST includes an upper part 160ST_UP and a lower part 160ST_LP. The upper part 160ST_UP is disposed on the lower part 160ST_LP. The part 160ST_UP is directly connected to the lower part 160ST_LP.

The gate separation structure 160ST may be divided into the upper and lower parts 160ST_UP and 160ST_LP based on the upper surface NS1_US of the first sheet patterns NS1 and/or the upper surface NS2_US of the second sheet patterns NS2. For example, a vertical level of the upper surface NS1_US of the uppermost first sheet pattern NS1 and/or the upper surface NS2_US of the uppermost second sheet pattern NS2 may be a fiducial/reference level to divide the gate separation structure 160ST into the upper and lower parts 160ST_UP and 160ST_LP. The upper part 160ST_UP may be disposed above the upper surface NS1_US of the first sheet patterns NS1 and/or the upper surface NS2_US of the second sheet patterns NS2. The upper part 160ST_UP may protrude beyond the upper surface NS1_US of the first sheet patterns NS1 and/or the upper surface NS2_US of the second sheet patterns NS2. The lower part 160ST_LP may be disposed below the upper surface NS1_US of the first sheet patterns NS1 and/or the upper surface NS2_US of the second sheet patterns NS2.

The gate separation structure 160ST includes a gate separation pattern 160. The gate separation pattern 160 includes first sidewall 160_SW1 and the second sidewall 160_SW2. The first sidewall 160_SW1 of the gate separation pattern 160 may be counter to the second sidewall 160_SW2 of the gate separation pattern 160 in the second direction DR2. For example, the first sidewall 160_SW1 of the gate separation pattern 160 may be opposite to the second sidewall 160_SW2 of the gate separation pattern 160 in the second direction DR2.

The first sidewall 160_SW1 of the gate separation pattern 160 faces the first sheet patterns NS1. The second sidewall 160_SW2 of the gate separation pattern 160 faces the second sheet patterns NS2.

An upper surface 160US of the gate separation pattern 160 is the upper surface of the gate separation structure 160ST. The upper surface 160US may be placed on the same plane as the upper surface 145US of the first gate capping pattern 145 and the upper surface 245US of the second gate capping pattern 245.

The sidewalls of the gate separation structure 160ST may be the first sidewall 160_SW1 and the second sidewall 160_SW2 of the gate separation pattern 160. A first sidewall of the upper part 160ST_UP of the gate separation structure 160ST may be part of the first sidewall 160_SW1 of the gate separation pattern 160. A second sidewall of the upper part 160ST_UP of the gate separation structure 160ST may be part of the second sidewall 160_SW2 of the gate separation pattern 160.

The gate separation pattern 160 does not overlap with the first sheet patterns NS1 in the third direction DR3. The gate separation pattern 160 does not separate the second sheet patterns NS2 in the third direction DR3.

The gate separation pattern 160 may include or be formed of at least one of, for example, silicon nitride(SiN), silicon oxynitride(SiON), silicon oxide(SiO₂), silicon oxycarbonitride(SiOCN), silicon boronitride(SiBN), silicon oxyboronitride(SiOBN), silicon oxycarbide(SiOC), aluminum oxide (AlO), and a combination thereof. The gate separation pattern 160 is illustrated as being a single-layer film, but the present disclosure is not limited thereto.

A first distance L1 between the gate separation pattern 160 and the first sheet patterns NS1 may be less than a second distance L2 between the gate separation pattern 160 and the second sheet patterns NS2. The gate separation pattern 160 may be closer to the first sheet patterns NS1 than to the second sheet patterns NS2.

For example, the first distance L1 may be the distance between the first sheet pattern NS1 disposed uppermost among the plurality of first sheet patterns NS1 and the gate separation pattern 160. For example, the second distance L2 may be the distance between the second sheet pattern NS2 disposed uppermost among the plurality of second sheet patterns NS2 and the gate separation pattern 160.

The first distance L1 may be the distance between the upper part 160ST_UP of the gate separation structure 160ST and the first sheet patterns NS1. Specifically, the first distance L1 may be the distance from the first sidewall of the upper part 160ST_UP of the gate separation structure 160ST to the first sheet pattern NS1 disposed uppermost among the plurality of first sheet patterns NS1. The second distance L2 may be the distance between the upper part 160ST_UP of the gate separation structure 160ST and the second sheet patterns NS2. Specifically, the second distance L2 may be the distance from the second sidewall of the upper part 160ST_UP of the gate separation structure 160ST to the second sheet pattern NS2 disposed uppermost among the plurality of second sheet patterns NS2. The distances L1 and L2 may be measured in the second direction DR2.

The first gate structure 115 includes a first terminal region 115_EP and a first extension region 115_EX. The first terminal region 115_EP is disposed between the first active pattern AP1 and the gate separation pattern 160.

The first gate structure 115 may be divided into the first terminal region 115_EP of the first gate structure 115 and the first extension region 115_EX of the first gate structure 115 based on the uppermost first sheet pattern NS1. For example, an end point of the uppermost first sheet pattern NS1 in the second direction DR2 facing and/or closest to the gate separation pattern 160 may be a fiducial/reference point to divide the first gate structure 115 into the first terminal region 115_EP and the first extension region 115_EX in the second direction DR2.

The second gate structure 215 includes a second terminal region 215_EP and a second extension region 215_EX. The second terminal region 215_EP is disposed between the second active pattern AP2 and the gate separation pattern 160.

The second gate structure 215 may be divided into the second terminal region 215_EP of the second gate structure 215 and the second extension region 215_EX of the second gate structure 215 based on the uppermost second sheet pattern NS2. For example, an end point of the uppermost second sheet pattern NS2 in the second direction DR2 facing and/or closest to the gate separation pattern 160 may be a fiducial/reference point to divide the second gate structure 215 into the second terminal region 215_EP and the second extension region 215_EX in the second direction DR2.

A first height H1 from a vertical level of the bottom surface of the fin trench FT to the lowermost part of the first terminal region 115_EP may be greater than a second height H2 from the vertical level of the bottom surface of the fin trench FT to the lowermost part of the second terminal region 215_EP.

In the semiconductor device according to some embodiments, the first height H1 from the vertical level of the bottom surface of the fin trench FT to the lowermost part of the first terminal region 115_EP may be less than a third height H3 from the vertical level of the bottom surface of the fin trench FT to the upper surface BP1_US of the first lower pattern BP1. The second height H2 may be less than the third height H3 from the bottom surface of the fin trench FT to the upper surface BP1_US of the first lower pattern BP1. For example, the heights H1, H2 and H3 may be distances in the third direction DR3.

The first gate insulating films 130 may extend along and/or contact the first sidewall 160_SW1 of the gate separation pattern 160. The second gate insulating films 230 may extend along and/or contact the second sidewall 160_SW2 of the gate separation pattern 160.

The first gate insulating films 130 are not disposed between the gate separation pattern 160 and the first gate capping pattern 145. For example, the gate separation pattern 160 may contact the first gate capping pattern 145. The second gate insulating films 230 are not disposed between the gate separation pattern 160 and the second gate capping pattern 245. For example, the gate separation pattern 160 may contact the second gate capping pattern 245.

For example, the upper surface 220US of the second gate electrode 220 may include a climbing region 220US_CL. In the climbing region 220US_CL of the second gate electrode 220, the upper surface 220US of the second gate electrode 220 may be gradually lowered in a direction receding from the second sidewall 160_SW2 of the gate separation pattern 160. For example, the upper surface 220US of the second gate electrode 220 may gradually ascend in a direction approaching the second sidewall 160_SW2 of the gate separation pattern 160. The climbing region 220US_CL of the second gate electrode 220 is disposed near the boundary between the second gate structure 215 and the gate separation pattern 160.

The upper surface 120US of the first gate electrode 120, like the upper surface 220US of the second gate electrode 220, may include a climbing region. For example, the upper surface 220US of the first gate electrode 120 may gradually ascend in a direction approaching the first sidewall 160_SW1 of the gate separation pattern 160.

The interlayer insulating films 190 may be disposed on the source/drain patterns 150. The interlayer insulating films 190 may include or be formed of, for example, silicon oxide, silicon nitride, silicon oxynitride, flowable oxide (FOX), tonen silazen (TOSZ), undoped silicate glass (USG), borosilicate glass (BSG), phosphosilicate glass (PSG), borophosphosilicate glass (BPSG), plasma-enhanced tetraethylorthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, polyimide, a porous polymeric material, or a combination thereof, but the present disclosure is not limited thereto.

Source/drain contacts 180 are disposed on the source/drain patterns 150. The source/drain contacts 180 are electrically connected to the source/drain patterns 150.

As used herein, components described as being "electrically connected" are configured such that an electrical signal can be transferred from one component to the other (although such electrical signal may be attenuated in strength as it transferred and may be selectively transferred).

The source/drain contacts 180 may include or be formed of contact barrier films 181 and contact filling films 182. Metal silicide films 155 may be further disposed between the source/drain contacts 180 and the source/drain patterns 150.

The contact barrier films 181 may include or be formed of at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), Zr, zirconium nitride (ZrN), vanadium (V), vanadium nitride (VN), niobium (Nb), niobium nitride (NbN), platinum (Pt), iridium (Ir), rhodium (Rh) and a 2D material. The 2D material may be a metallic material and/or a semiconductor material. The 2D material may include a 2D allotrope or a 2D compound such as, for example, at least one of graphene, molybdenum disulfide ($MoS_2$), molybdenum diselenide ($MoSe_2$), tungsten diselenide ($WSe_2$), and tungsten disulfide ($WS_2$), but the present disclosure is not limited thereto. Alternatively, the contact filling films 182 may include at least one of aluminum (Al), tungsten (W), cobalt (Co), ruthenium (Ru), silver (Ag), gold (Au), manganese (Mn) and Mo. The metal silicide films 155 may include or be formed of a metal silicide.

Differently from the embodiment illustrated in FIGS. 2 and 3, the source/drain contacts 180 may not include the contact barrier films 181 in certain embodiments.

Figure 5:
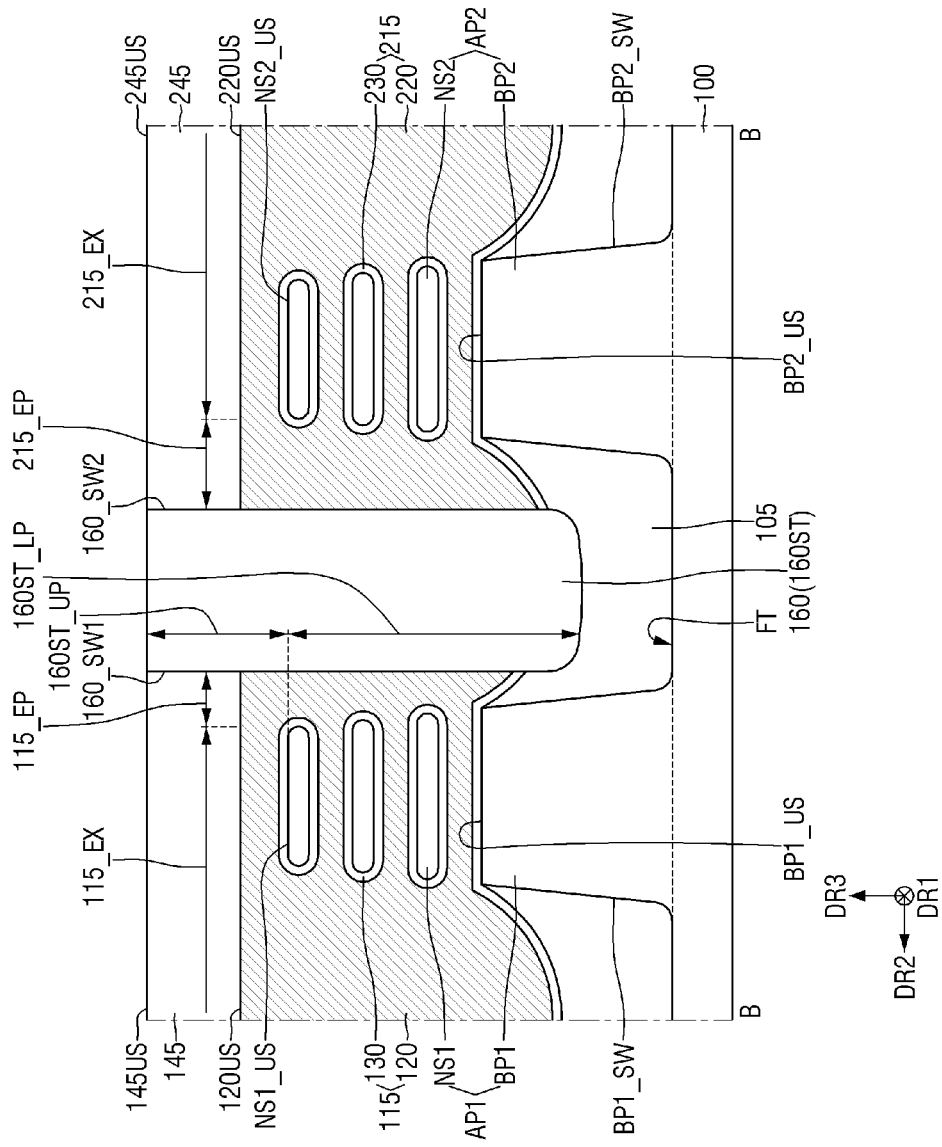
FIG. 5 is a cross-sectional view of a semiconductor device according to some embodiments of the present disclosure.
Figure 6:
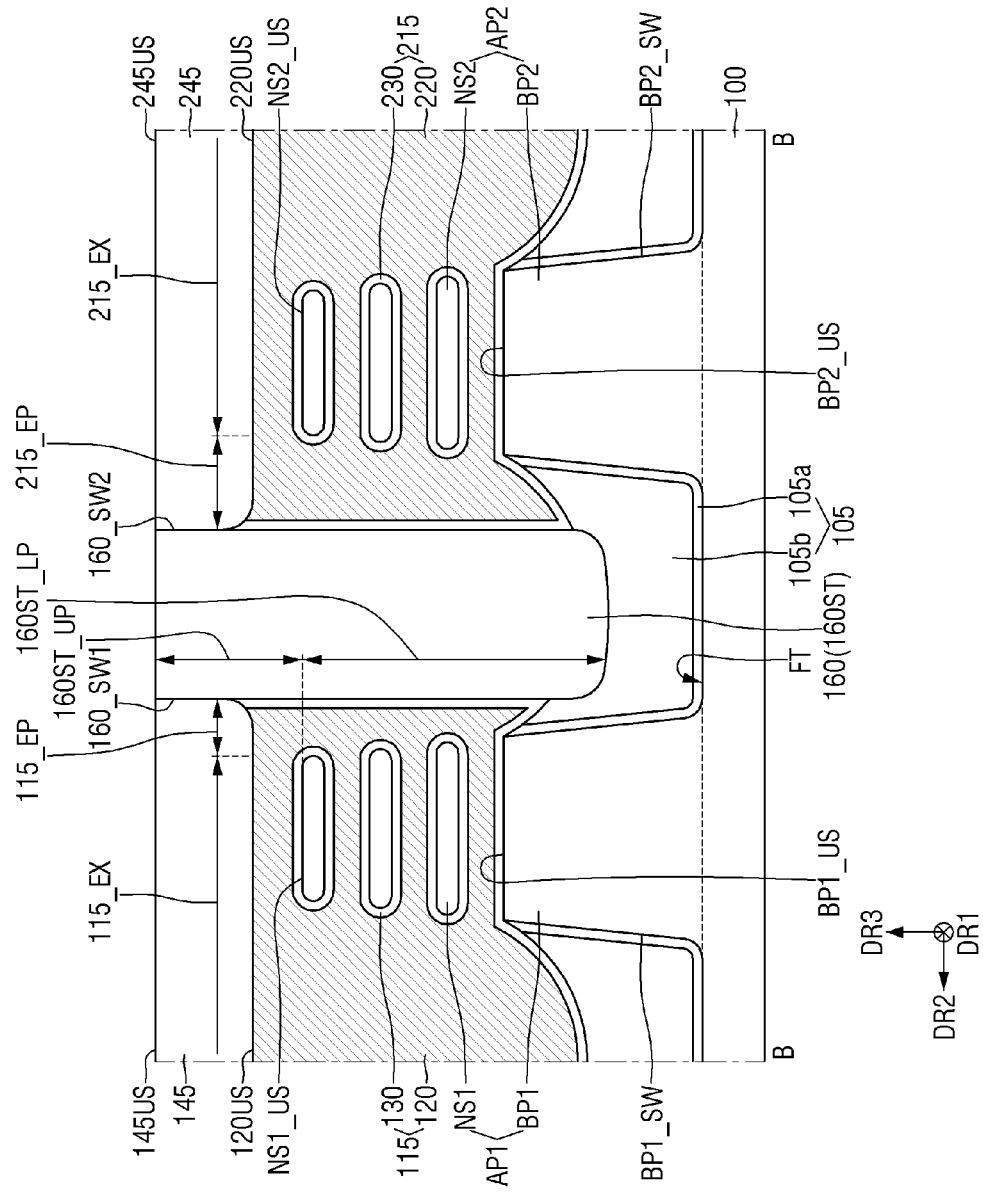
FIG. 6 is a cross-sectional view of a semiconductor device according to some embodiments of the present disclosure.
Figure 7:
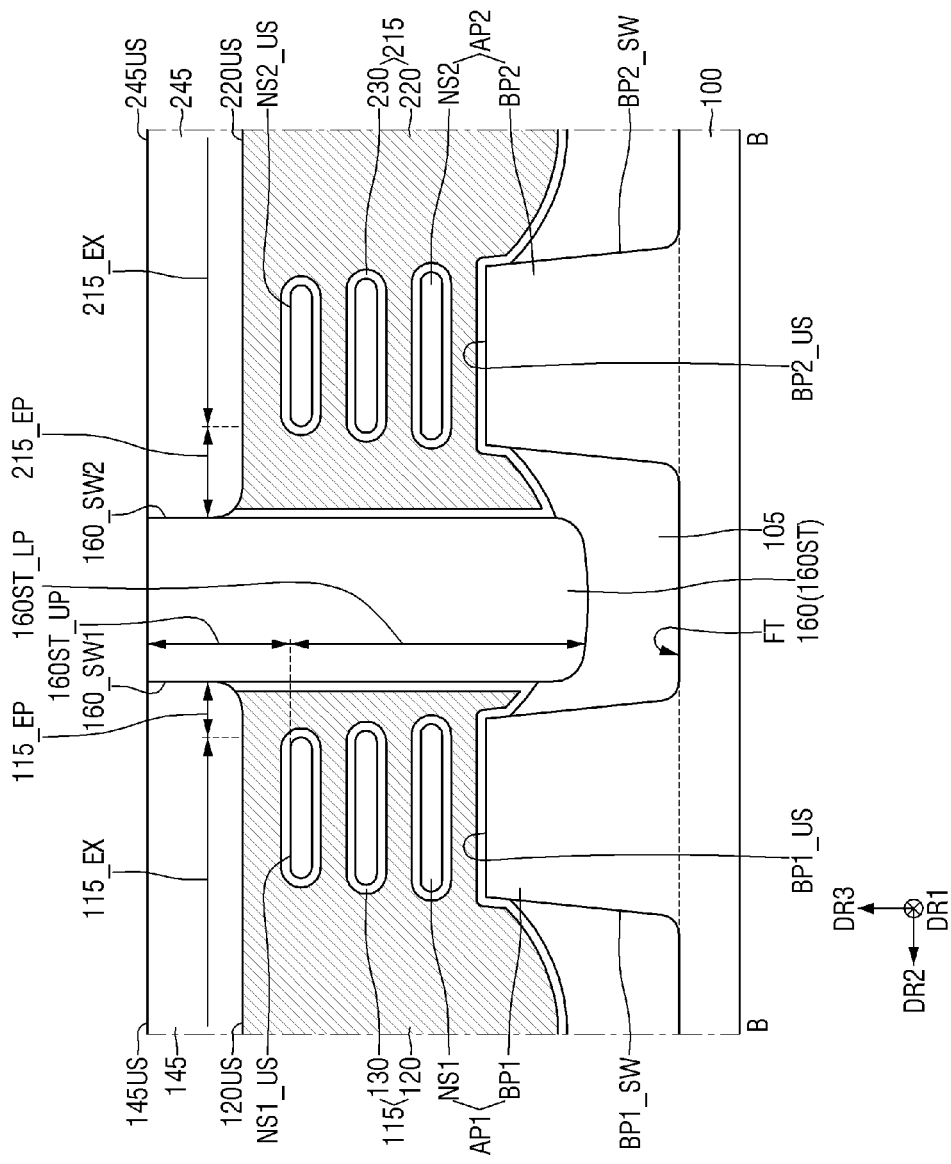
FIG. 7 is a cross-sectional view of a semiconductor device according to some embodiments of the present disclosure.

FIG. 5 is a cross-sectional view of a semiconductor device according to some embodiments of the present disclosure. FIG. 6 is a cross-sectional view of a semiconductor device according to some embodiments of the present disclosure. FIG. 7 is a cross-sectional view of a semiconductor device according to some embodiments of the present disclosure. The embodiments of FIGS. 5 through 7 will hereinafter be described, focusing mainly on the differences from the embodiment of FIGS. 1 through 4.

Referring to FIG. 5, first gate insulating films 130 do not extend along a first sidewall 160_SW1 of a gate separation pattern 160, and second gate insulating films 230 do not extend along a second sidewall 160_SW2 of the gate separation pattern 160.

A first gate electrode 120 may be in contact with the first sidewall 160_SW1 of the gate separation pattern 160. A second gate electrode 220 may be in contact with the second sidewall 160_SW2 of the gate separation pattern 160.

An upper surface 220US of the second gate electrode 220 may not include a climbing region (see "220US_CL" of FIG. 4). An upper surface 120US of the first gate electrode 120 may not include a climbing region.

Referring to FIG. 6, a field insulating film 105 may include a field liner 105a and a field filling film 105b, which is on the field liner 105a.

The field liner 105a may extend along and/or contact the sidewalls and the bottom surface of a fin trench FT. The field filling film 105b may fill the fin trench FT where the field liner 105a is formed.

Referring to FIG. 7, in the semiconductor device according to some embodiments, a field insulating film 105 may cover a portion of a sidewall BP1_SW of a first lower pattern BP1 and/or a portion of a sidewall BP2_SW of a second lower pattern BP2 defining the fin trench FT.

The other portion of the first lower pattern BP1 and/or the other portion of the second lower pattern BP2 may protrude beyond the upper surface of the field insulating film 105 in the third direction DR3. For example, the uppermost part of the first lower pattern BP1 and/or the uppermost part of the second lower pattern BP2 may be at a higher vertical level than the uppermost part of the field insulating film 105.

First gate insulating films 130 may extend along the rest (the other portion) of the sidewall BP1_SW of the first lower pattern BP1. First gate insulating films 130 may be in contact with the rest of the sidewall BP1_SW of the first lower pattern BP1.

Second gate insulating films 230 may extend along the rest (the other portion) of the sidewall BP2_SW of the second lower pattern BP2. Second gate insulating films 230 may be in contact with the rest of the sidewall BP2_SW of the second lower pattern BP2.

Figure 8:
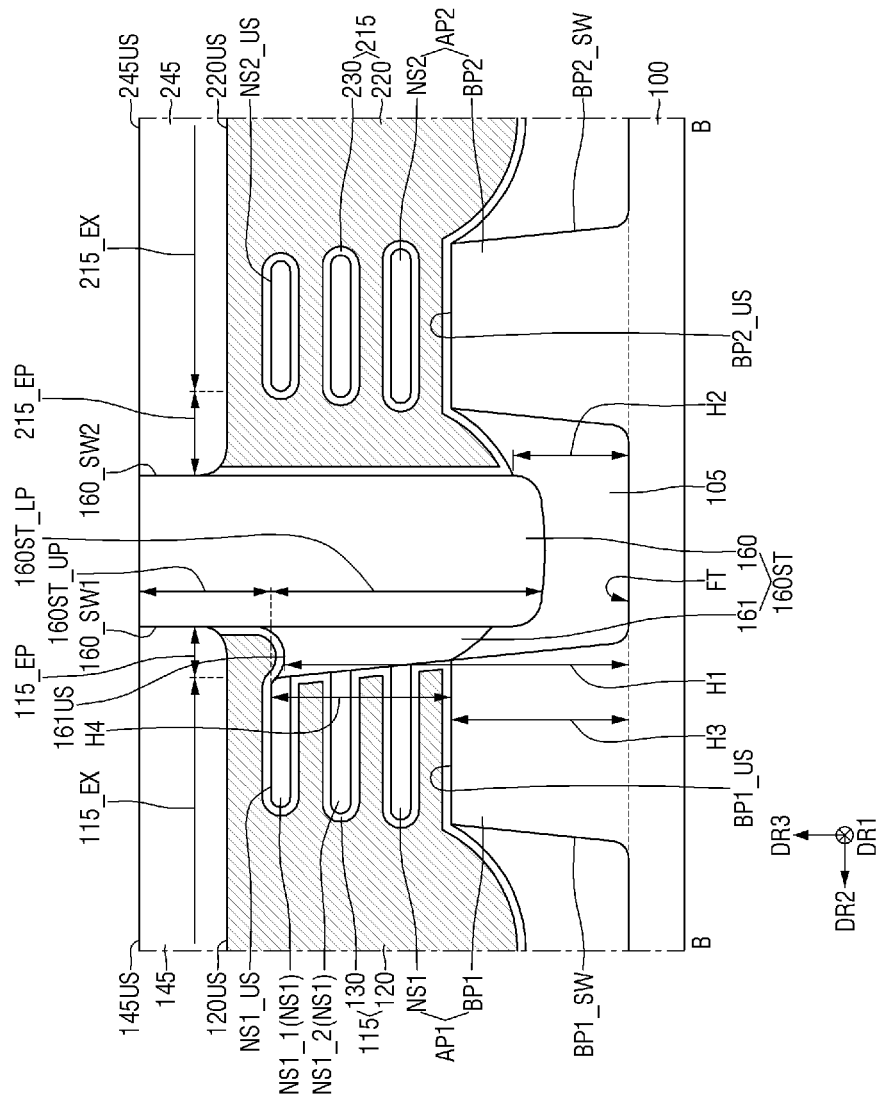
FIG. 8 is a cross-sectional view of a semiconductor device according to some embodiments of the present disclosure.

FIG. 8 is a cross-sectional view of a semiconductor device according to some embodiments of the present disclosure. The embodiment of FIG. 8 will hereinafter be described, focusing mainly on the differences from the embodiment of FIGS. 1 through 4.

Referring to FIG. 8, in the semiconductor device according to some embodiments a gate separation structure 160ST may include a gate separation pattern 160 and a first separation sidewall pattern 161.

The first separation sidewall pattern 161 may be disposed between the gate separation pattern 160 and the first sheet patterns NS1. The first separation sidewall pattern 161 may protrude from the gate separation pattern 160 toward the first sheet patterns NS1.

The first separation sidewall pattern 161 may cover a portion of a first sidewall 160_SW1 of the gate separation pattern 160. The first separation sidewall pattern 161 may be disposed on a portion of the first sidewall 160_SW1 of the gate separation pattern 160.

For example, the first separation sidewall pattern 161 may be in contact with a field insulating film 105. The first separation sidewall pattern 161 may be in contact with the first sheet patterns NS1. The gate separation structure 160ST may be in contact with the first sheet patterns NS1.

A lower part 160ST_LP of the gate separation structure 160 may include the first separation sidewall pattern 161. An upper part 160ST_UP of the gate separation structure 160 may not include the first separation sidewall pattern 161.

An upper surface 161US of the first sidewall pattern 161 may be higher than an upper surface BP1_US of a first lower pattern BP1, e.g., considering heights from a vertical level of the bottom surface of a fin trench FT. The upper surface 161US of the first separation sidewall pattern 161 may be lower than an upper surface NS1_US of the uppermost first sheet pattern NS1, e.g., considering heights from a vertical level of the upper surface BP1_US of the first lower pattern BP1.

The first gate structure 115 covers the upper surface 161US of the first separation sidewall pattern 161. The first gate structure 115 is in contact with the upper surface 161US of the first separation sidewall pattern 161.

A portion of the first gate structure 115 is disposed on the first separation sidewall pattern 161. The first terminal region 115_EP of the first gate structure 115 may be disposed on the upper surface 161US of the first separation sidewall pattern 161.

The first gate structure 115 is in contact with the upper part 160ST_UP of the gate separation structure 160. The first gate structure 115 may be in contact with part of the first sidewall 160_SW1 of the gate separation pattern 160, which is a first sidewall of the upper part 160ST_UP of the gate separation structure 160.

A first gate insulating film 130 extends along the upper surface 161US of the first separation sidewall pattern 161. The first gate insulating film 130 extends along part of the first sidewall 160_SW1 of the gate separation pattern 160, e.g., the first sidewall of the upper part 160ST_UP of the gate separation pattern 160.

The first separation sidewall pattern 161 may include a first sidewall facing the first sheet patterns NS1 and a second sidewall facing the gate separation pattern 160. The first sidewall of the first separation sidewall pattern 161 may include first parts facing the first sheet patterns NS1 and second parts between the first sheet patterns NS1 which are adjacent to one another in the third direction DR3. For example, the first parts and the second parts of the first separation sidewall pattern 161 may be alternately disposed in the third direction DR3. The first gate insulating film 130 extends along and/or contacts the second parts of the first sidewall of the first separation sidewall pattern 161.

In the semiconductor device according to the embodiment illustrated in FIG. 8, the first height H1 from a vertical level of the bottom surface of the fin trench FT to the lowermost part of the first terminal region 115_EP may be greater than a third height H3 from the vertical level of the bottom surface of the fin trench FT to the upper surface BP1_US of the first lower pattern BP1. However, a second height H2 from the vertical level of the bottom surface of the fin trench FT to the lowermost part of a second terminal region 215_EP may be lower than the third height H3 from the vertical level of the bottom surface of the fin trench FT to the upper surface BP1_US of the first lower pattern BP1.

The first height H1 from the vertical level of the bottom surface of the fin trench FT to the lowermost part of the first terminal region 115_EP may be lower than the height H3+H4 from the vertical level of the bottom surface of the fin trench FT to the upper surface NS1_US of the uppermost first sheet pattern NS1.

The first separation sidewall pattern 161 may include or be formed of an insulating material. For example, the first separation sidewall pattern 161 may include or be formed of a semiconductor oxide such as silicon oxide or germanium oxide, but the present disclosure is not limited thereto. In a case where the gate separation pattern 160 includes silicon oxide, the boundary between the first separation sidewall pattern 161 and the gate separation pattern 160 may not be distinguishable.

In another example, the first separation sidewall pattern 161 may include or be formed of a plurality of films. The first separation sidewall pattern 161 may include or be formed of a semiconductor oxide and a semiconductor nitride, but the present disclosure is not limited thereto.

In the semiconductor device according to some embodiments, the first gate structure 115 may not surround at least one of the first sheet patterns NS1 of the plurality of the first sheet pattern NS1. For example, a portion of the first sheet patterns NS1 in contact with the first separation sidewall pattern 161 may not be surrounded by the first gate structure 115. The second gate structure 215 may surround a plurality of second sheet patterns NS2.

The first gate structure 115 may not surround the first sheet patterns NS1. The first sheet patterns NS1 may include an upper first sheet pattern NS1_1 and a lower first sheet pattern NS1_2. The first gate structure 115 does not surround the upper first sheet pattern NS1_1 and lower first sheet pattern NS1_2. The first gate insulating film 130 does not surround the upper first sheet pattern NS1_1 and the lower first sheet pattern NS1_2. Although not specifically illustrated, the first gate structure 115 may surround the upper first sheet pattern NS1_1, but not the lower first sheet pattern NS1_2.

The upper first sheet pattern NS1_1 is illustrated as being the uppermost first sheet pattern NS1, but the present disclosure is not limited thereto. The upper first sheet pattern NS1_1 and the lower first sheet pattern NS1_2 are illustrated in FIG. 8 as being the closest sheet patterns to each other in the third direction DR3, but the present disclosure is not limited thereto.

The upper surface 161US of the first separation sidewall pattern 161 is illustrated as being a concave surface, but the present disclosure is not limited thereto. Alternatively, the upper surface 161US of the first separation sidewall pattern 161 may be a flat surface.

The width, in a second direction DR2, of the first separation sidewall pattern 161 above the vertical level of the upper surface BP1_US of the first lower pattern BP1 may gradually increase in a direction receding from the field insulating film 105. Alternatively, the width, in a second direction DR2, of the first separation sidewall pattern 161 above the vertical level of the upper surface BP1_US of the first lower pattern BP1 may be uniform/constant along the third direction DR3 (e.g., the vertical direction).

Figure 9:
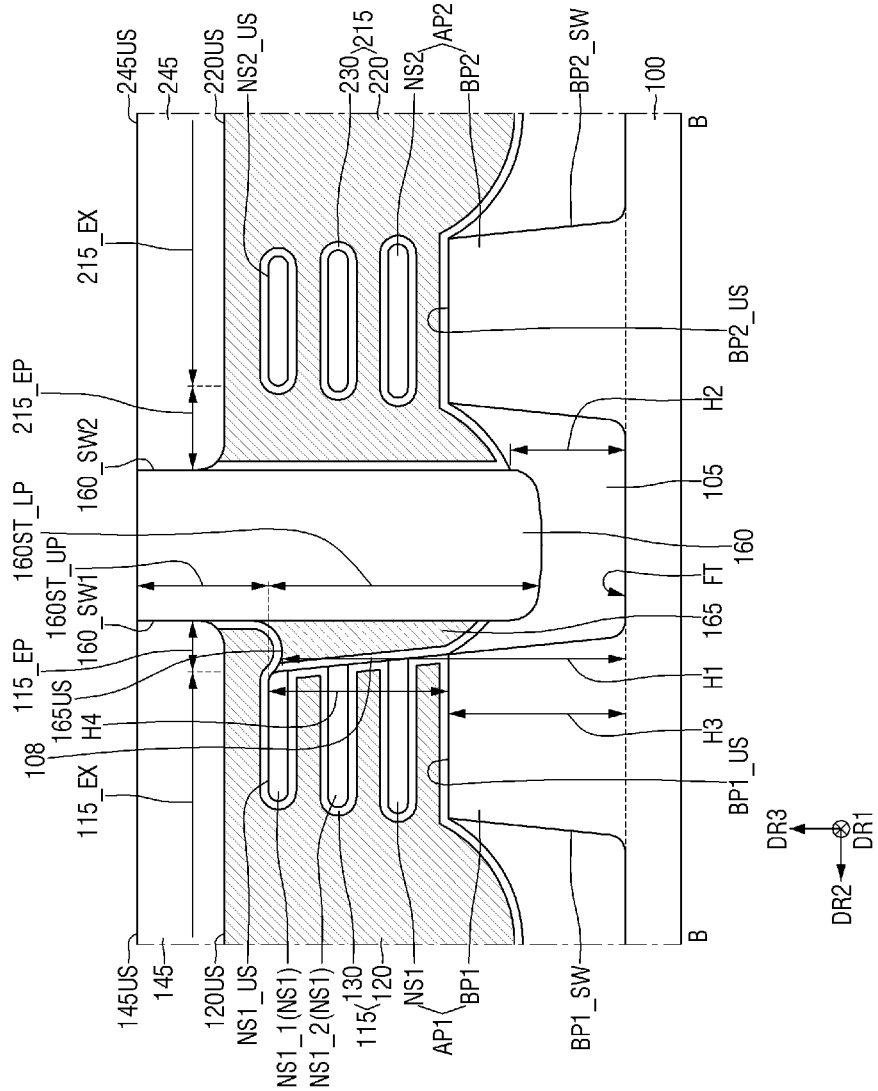
FIG. 9 is a cross-sectional view of a semiconductor device according to some embodiments of the present disclosure.

FIG. 9 is a cross-sectional view of a semiconductor device according to some embodiments of the present disclosure. The embodiment of FIG. 9 will hereinafter be described, focusing mainly on the differences from the embodiment of FIGS. 1 through 4.

Referring to FIG. 9, the semiconductor device according to some embodiments of the present disclosure may further include a first semiconductor material pattern 165, which is disposed between the gate separation pattern 160 and the first sheet patterns NS1.

The first semiconductor material pattern 165 may protrude from the gate separation pattern 160 toward the first sheet patterns NS1. The first semiconductor material pattern 165 may cover a portion of a first sidewall 160_SW1 of the gate separation pattern 160. The first semiconductor material pattern 165 may be disposed on the portion of the first sidewall 160_SW1 of the gate separation pattern 160. For example, the first semiconductor material pattern 165 may be in contact with the gate separation pattern 160.

The first semiconductor material pattern 165 may be disposed on a first sidewall of a lower part 160ST_LP of the gate separation structure 160. Alternatively, the first semiconductor material pattern 165 may not be disposed on the first sidewall of a lower part 160ST_LP of the gate separation structure 160.

A first insulating liner 108 may be disposed between the first semiconductor material pattern 165 and the first sheet patterns NS1. The first insulating liner 108 is illustrated as extending along the upper surface of a field insulating film 105, but the present disclosure is not limited thereto. The first insulating liner 108 may include or be formed of at least one of silicon oxide and silicon nitride, but the present disclosure is not limited thereto.

The upper surface 165US of the first semiconductor material pattern 165 may be higher than an upper surface BP1_US of a first lower pattern BP1, e.g., considering heights from a vertical level of the bottom surface of a fin trench FT. The upper surface 165US of the first semiconductor material pattern 165 may be lower than an upper surface NS1_US of the first sheet pattern NS1, e.g., considering heights from a vertical level of the upper surface BP1_US of the first lower pattern BP1.

A first gate structure 115 covers the upper surface 165US of the first semiconductor material pattern 165. The first gate structure 115 is in contact with the upper surface 165US of the first semiconductor material pattern 165.

A portion of the first gate structure 115 is disposed on the first semiconductor material pattern 165. The first terminal region 115_EP of the first gate structure 115 may be disposed on the upper surface 165US of the first semiconductor material pattern 165.

The first gate structure 115 is in contact with the upper part 165ST_UP of the gate separation structure 160. The first gate structure 115 may be in contact with a portion of the first sidewall 160_SW1 of the gate separation pattern 160, e.g., a first sidewall of the upper part 165ST_UP of the gate separation structure 160.

A first gate insulating film 130 may extend along and/or contact the upper surface 165US of the first semiconductor material pattern 165. The first gate insulating film 130 may extend along and/or contact part of the first insulating liner 108.

A first height H1 from a vertical level of the bottom surface of the fin trench FT to the lowermost part of the first terminal region 115_EP may be greater than a third height H3 from the vertical level of the bottom surface of the fin trench FT to the upper surface BP1_US of the first lower pattern BP1. The first height H1 from the vertical level of the bottom surface of the fin trench FT to the lowermost part of the first terminal region 115_EP may be lower than the height H3+H4 from the vertical level of the bottom surface of the fin trench FT to the upper surface NS1_US of the uppermost first sheet pattern NS1.

The first semiconductor material pattern 165 may include or be formed of a semiconductor material such as, for example, silicon(Si), silicon germanium(SiGe), or germanium (Ge).

In the semiconductor device according to some embodiments, the first gate structure 115 does not surround at least one of the first sheet patterns NS1. For example, portions of the first sheet patterns NS1 in contact with the first insulating liner 108 may not be surrounded by the first gate structure 115. A second gate structure 215 may surround a plurality of second sheet patterns NS2, e.g., in a cross-sectional view.

Figure 10:
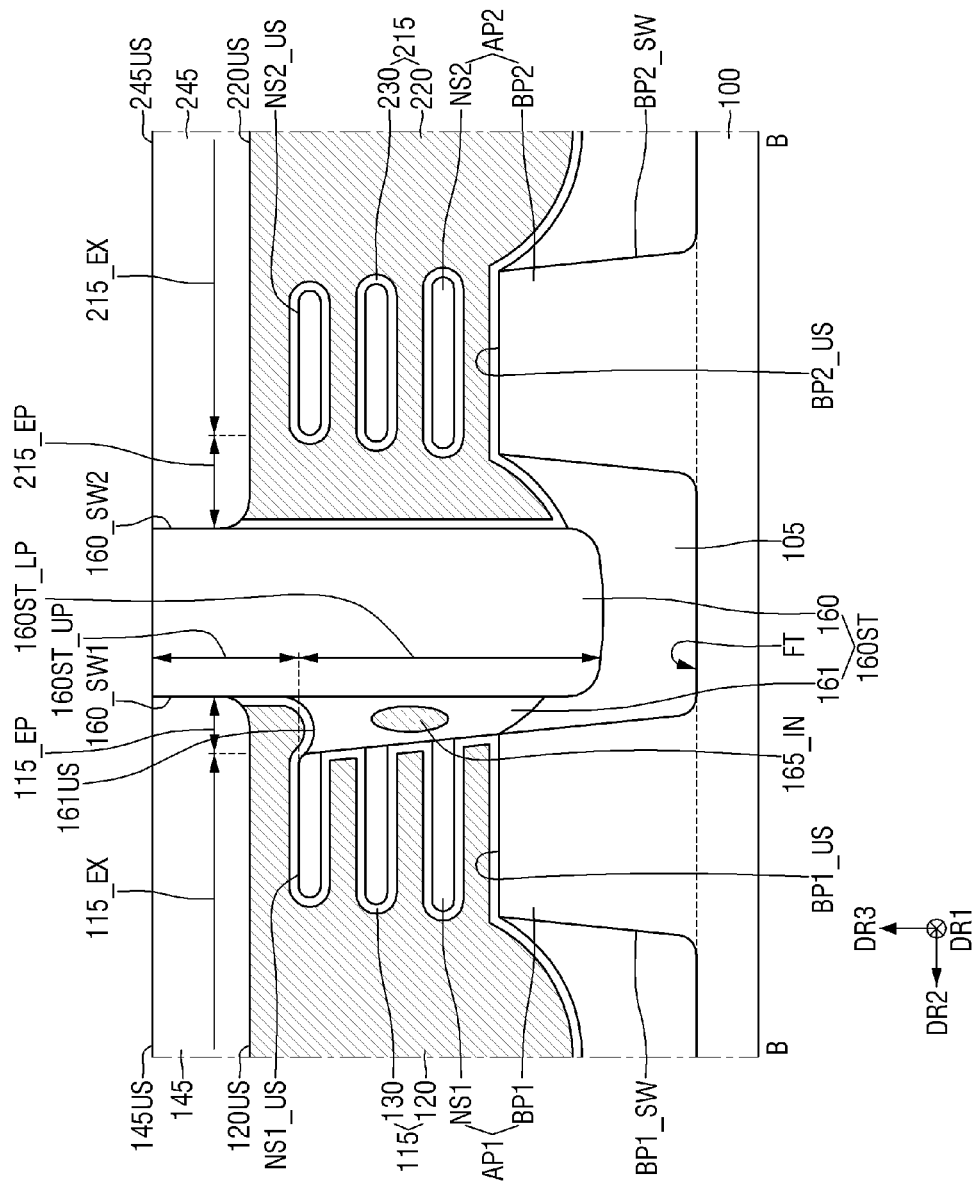
FIG. 10 is a cross-sectional view of a semiconductor device according to some embodiments of the present disclosure.

FIG. 10 is a cross-sectional view of a semiconductor device according to some embodiments of the present disclosure. The embodiment of FIG. 10 will hereinafter be described, focusing mainly on the differences from the embodiment of FIG. 8.

Referring to FIG. 10, the semiconductor device according to some embodiments of the present disclosure may further include a first inner semiconductor pattern 165IN, which is disposed in a first separation sidewall pattern 161.

The first separation sidewall pattern 161 may surround the first inner semiconductor pattern 165IN. In certain embodiments, all of the outer circumference of the first inner semiconductor pattern 165IN may not necessarily be covered by the first separation sidewall pattern 161. For example, a portion of the outer circumference of the first inner semiconductor pattern 165IN may contact a pattern other than the first separation sidewall pattern 161, e.g., a first sheet pattern NS1, the first gate structure 115, or the gate separation pattern 160.

Figure 11:
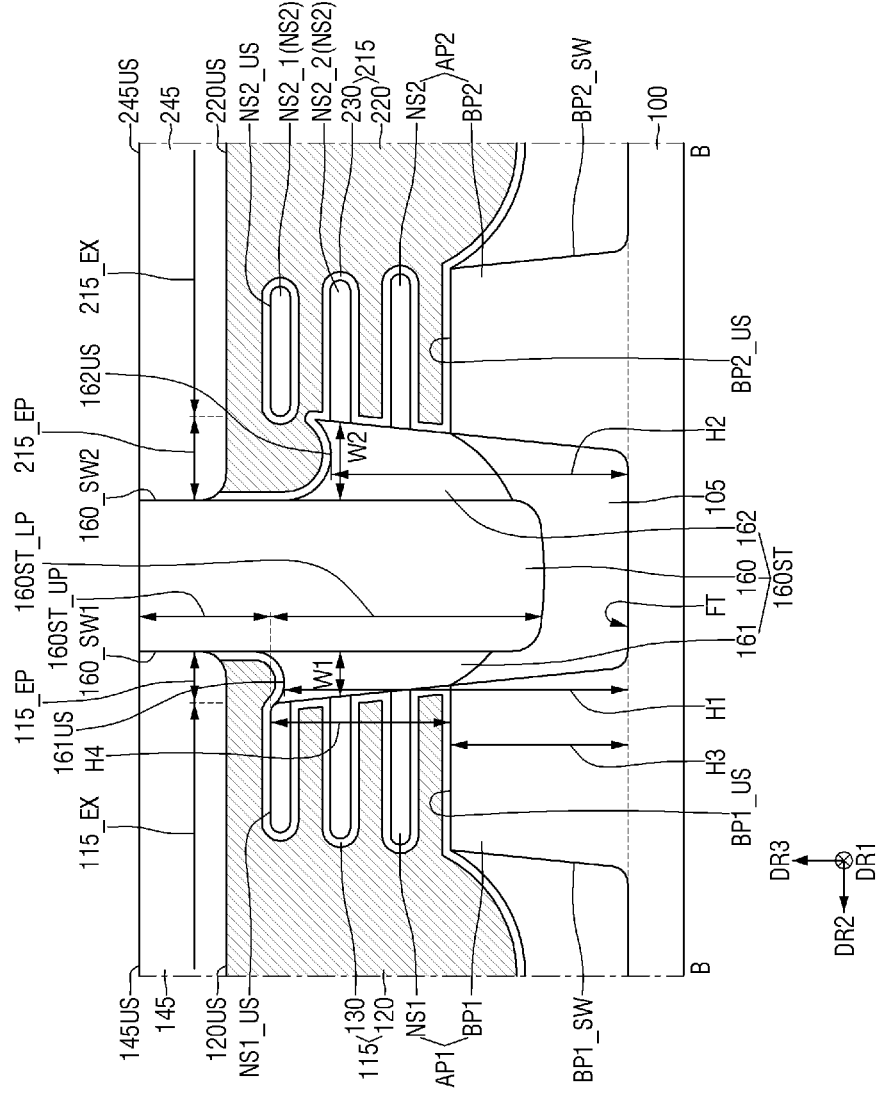
FIG. 11 is a cross-sectional view of a semiconductor device according to some embodiments of the present disclosure.

FIG. 11 is a cross-sectional view of a semiconductor device according to some embodiments of the present disclosure. The embodiment of FIG. 11 will hereinafter be described, focusing mainly on the differences from the embodiment of FIG. 8.

Referring to FIG. 11, a gate separation structure 160ST may include a gate separation pattern 160, a first separation sidewall pattern 161, and a second separation sidewall pattern 162.

The second separation sidewall pattern 162 may be disposed between the gate separation pattern 160 and second sheet patterns NS2. The second separation sidewall pattern 162 may protrude from the gate separation pattern 160 toward the second sheet patterns NS2.

The second separation sidewall pattern 162 covers a portion of a second sidewall 160_SW2 of the gate separation pattern 160. The second separation sidewall pattern 162 is disposed on the portion of the second sidewall 160_SW2 of the gate separation pattern 160.

For example, the second separation sidewall pattern 162 may be in contact with a field insulating film 105. The second separation sidewall pattern 162 may be in contact with the second sheet patterns NS2. For example, the gate separation structure 160ST may be in contact with first sheet patterns NS1 and the second sheet patterns NS2.

A lower part 160ST_LP of the gate separation structure 160 may include the first separation sidewall pattern 161 and the second separation sidewall pattern 162. An upper part 160ST_UP of the gate separation structure 160 may not include the first separation sidewall pattern 161 and the second separation sidewall pattern 162.

An upper surface 162US of the second separation sidewall pattern 162 may be higher than an upper surface BP2_US of a second lower pattern BP2, e.g., considering heights from a vertical level of the bottom surface of a fin trench FT. The upper surface 162US of the second separation sidewall pattern 162 may be lower than an upper surface NS2_US of the uppermost second sheet pattern NS2, e.g., considering heights from a vertical level of the upper surface BP2_US of the second lower pattern BP2.

A second gate structure 215 covers the upper surface 162US of the second separation sidewall pattern 162. The second gate structure 215 is contact with the upper surface 162US of the second separation sidewall pattern 162.

A portion of the second gate structure 215 is disposed on the second separation sidewall pattern 162. A second terminal region 215_EP of the second gate structure 215 may be disposed on the upper surface 162US of the second separation sidewall pattern 162.

The second gate structure 215 is in contact with the upper part 160ST_UP of the gate separation structure 160. The second gate structure 215 may be in contact with a second sidewall of the upper part 160ST_UP of the gate separation structure 160, e.g., part of the second sidewall 160_SW2 of the gate separation pattern 160.

A second gate insulating film 230 extends along and/or contacts the upper surface 162US of the second separation sidewall pattern 162. The second gate insulating film 230 extends along and/or contacts the second sidewall of the upper part 160ST_UP of the gate separation structure 160, i.e., part of the second sidewall 160_SW2 of the gate separation pattern 160.

The second separation sidewall pattern 162 may have a first sidewall facing and/or being in contact with the second sheet patterns NS2 and a second sidewall facing and/or being in contact with the gate separation pattern 160. The first sidewall of the second separation sidewall pattern 162 may include first parts facing and/or being in contact with the second sheet patterns NS2 and second parts between the second sheet patterns NS2, which are adjacent to one another in a third direction DR3. For example, the first parts and the second parts of the second separation sidewall pattern 162 may be alternately disposed in the third direction DR3. The second gate insulating film 230 extends along and/or contacts the second parts of the first sidewall of the second separation sidewall pattern 162.

In the semiconductor device according to some embodiments, the first height H1 from a vertical level of the bottom surface of the fin trench FT to the lowermost part of a first terminal region 115_EP of a first gate structure 115 may be greater than a third height H3 from the vertical level of the bottom surface of the fin trench FT to an upper surface BP1_US of a first lower pattern BP1. The second height H2 from the vertical level of the bottom surface of the fin trench FT to the lowermost part of the second terminal region 215_EP may be greater than the third height H3 from the vertical level of the bottom surface of the fin trench FT to an upper surface BP1_US of a first lower pattern BP1. For example, the height from the vertical level of the bottom surface of the fin trench FT to the upper surface BP1_US of the first lower pattern BP1 may be substantially the same as the height from the vertical level of the bottom surface of the fin trench FT to the upper surface BP2_US of the second lower pattern BP2.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The second height H2 from the vertical level of the bottom surface of the fin trench FT to the lowermost part of the second terminal region 215_EP may be lower than the height H3+H4 from the vertical level of the bottom surface of the fin trench FT to an upper surface NS1_US of the uppermost first sheet pattern NS1. For example, the height from the vertical level of the bottom surface of the fin trench FT to the upper surface NS1_US of the uppermost first sheet pattern NS1 may be substantially the same as the height from the vertical level of the bottom surface of the fin trench FT to an upper surface NS2_US of the uppermost second sheet pattern NS2.

The second separation sidewall pattern 162 may include or be formed of an insulating material. For example, the second separation sidewall pattern 162 may include or be formed of a semiconductor oxide such as silicon oxide or germanium oxide, but the present disclosure is not limited thereto. In a case where the gate separation pattern 160 includes or be formed of silicon oxide, the boundary between the second separation sidewall pattern 162 and the gate separation pattern 160 may not be distinguishable.

In another example, the second separation sidewall pattern 162 may include or be formed of a plurality of films. The second separation sidewall pattern 162 may include or be formed of a semiconductor oxide and a semiconductor nitride, but the present disclosure is not limited thereto.

A width W1, in a second direction DR2, of the first separation sidewall pattern 161 differs from a width W2, in the second direction DR2, of the second separation sidewall pattern 162. For example, the width W1 of the first separation sidewall pattern 161 in a second direction DR2 may be lesser than the width W2 of the second separation sidewall pattern 162 in the second direction DR2. The widths of the first and second separation sidewall patterns may vary depending on vertical levels. At a vertical level of a first sheet pattern NS1 of the plurality of first sheet patterns NS1, the width W1 of the first separation sidewall pattern 161 and the width W2 of the second separation sidewall pattern 162 may be measured. For example, the widths W1 and W2 may be measured at the same vertical level.

In the semiconductor device according to some embodiments, the first gate structure 115 does not surround at least one of the first sheet patterns NS1. The second gate structure 215 does not surround at least one of the second sheet patterns NS2. For example, the first gate structure 115 may not surround portions of the first sheet patterns NS1 contacting the first separation sidewall pattern 161, and the second gate structure 215 may not surround portions of the second sheet patterns NS2 contacting the second separation sidewall pattern 162 as shown in FIG. 11.

The second sheet patterns NS2 may include an upper second sheet pattern NS2_1 and a lower second sheet pattern NS2_2. The second gate structure 215 may surround the upper second sheet pattern NS2_1. The second gate structure 215 does not surround the lower second sheet pattern NS2_2. The second gate insulating film 230 surrounds the upper second sheet pattern NS2_1, but does not surround the lower second sheet pattern NS2_2. Alternatively, the second gate structure 215 may not surround the upper second sheet pattern NS2__1 and lower second sheet pattern NS2_2.

The upper second sheet pattern NS2__1 is illustrated as being the uppermost second sheet pattern NS2, but the present disclosure is not limited thereto. The upper second sheet pattern NS2__1 and the lower second sheet pattern NS2__2 are illustrated as being adjacent to each other in the third direction DR3, but the present disclosure is not limited thereto.

Figure 12:
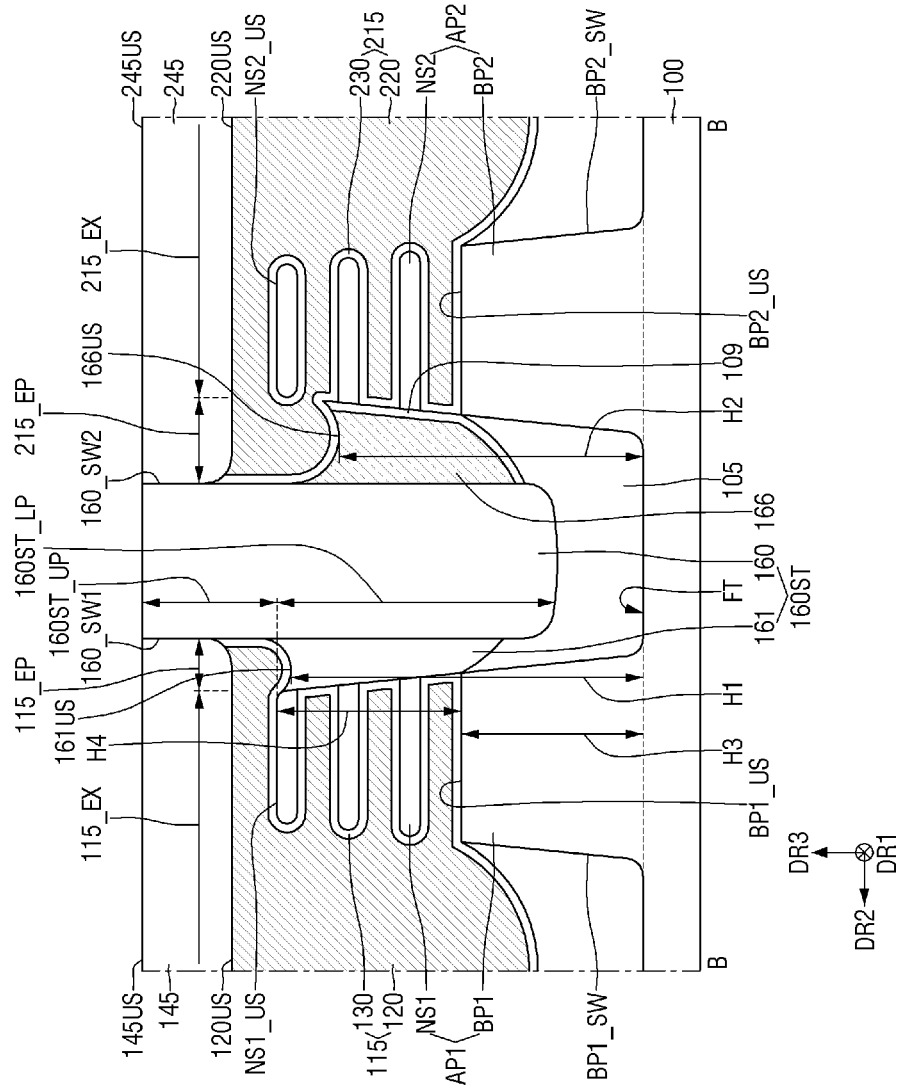
FIG. 12 is a cross-sectional view of a semiconductor device according to some embodiments of the present disclosure.

FIG. 12 is a cross-sectional view of a semiconductor device according to some embodiments of the present disclosure. The embodiment of FIG. 12 will hereinafter be described, focusing mainly on the differences from the embodiment of FIG. 8.

Referring to FIG. 12, the semiconductor device according to some embodiments of the present disclosure may further include a second semiconductor material pattern 166, which is disposed between a gate separation pattern 160 and second sheet patterns NS2.

The second semiconductor material pattern 166 may protrude from the gate separation pattern 160 toward the second sheet patterns NS2. The second semiconductor material pattern 166 covers a portion of a second sidewall 160_SW2 of the gate separation pattern 160. The second semiconductor material pattern 166 is disposed on part of the second sidewall 160_SW2 of the gate separation pattern 160. For example, the second semiconductor material pattern 166 may be in contact with the gate separation pattern 160.

The second semiconductor material pattern 166 may be disposed on a second sidewall of a lower part 160ST_LP of the gate separation structure 160. The second semiconductor material pattern 166 may not be disposed on a second sidewall of an upper part 160ST_UP of the gate separation structure 160.

A second insulating liner 109 may be disposed between the second semiconductor material pattern 166 and the second sheet patterns NS2. The second insulating liner 109 is illustrated as extending along and contacting the upper surface of a field insulating film 105 in FIG. 12, but the present disclosure is not limited thereto. The second insulating liner 109 may include or be formed of at least one of silicon oxide and silicon nitride, but the present disclosure is not limited thereto.

An upper surface 166US of the second semiconductor material pattern 166 may be higher than an upper surface BP2_US of a second lower pattern BP2, e.g., considering heights from a vertical level of the bottom surface of a fin trench FT. The upper surface 166US of the second semiconductor material pattern 166 may be lower than an upper surface NS2_US of the uppermost second sheet NS2, e.g., considering heights from a vertical level of the upper surface BP2_US of the second lower pattern BP2.

A second gate structure 215 covers the upper surface 166US of the second semiconductor material pattern 166. The second gate structure 215 is in contact with the upper surface 166US of the second semiconductor material pattern 166.

A portion of the second gate structure 215 is disposed on the second semiconductor material pattern 166. A second terminal region 215_EP of the second gate structure 215 may be disposed on the upper surface 166US of the second semiconductor material pattern 166.

The second gate structure 215 is in contact with the upper part 160ST_UP of the gate separation structure 160. The second gate structure 215 may be in contact with part of a second sidewall 160_SW2 of the gate separation pattern 160, e.g., a second sidewall of the upper part 160ST_UP of the gate separation structure 160.

A second gate insulating film 230 extends along and/or contacts the upper surface 166US of the second semiconductor material pattern 166. The second gate insulating film 230 extends along and/or contacts part of the second insulating liner 109.

A second height H2 from a vertical level of the bottom surface of the fin trench FT to the lowermost part of the second terminal region 215_EP may be greater than a third height H3 from the vertical level of the bottom surface of the fin trench FT to an upper surface BP1_US of a first lower pattern BP1. The second height H2 from the vertical level of the bottom surface of the fin trench FT to the lowermost part of the second terminal region 215_EP may be lower than the height H3+H4 from the vertical level of the bottom surface of the fin trench FT to an upper surface NS1_US of an uppermost first sheet pattern NS1.

The second semiconductor material pattern 166 may include or be formed of a semiconductor material such as, for example, Si, SiGe, or Ge.

In the semiconductor device according to some embodiments, the first gate structure 115 does not surround at least one of a plurality of the first sheet patterns NS1. The second gate structure 215 does not surround at least one of a plurality of the second sheet patterns NS2. For example, some portions of the first sheet patterns NS1 may not be covered by or contact the first gate structure 115 and some portions of the second sheet patterns NS2 may not be covered by or contact the second gate structure 215.

Unlike the illustration of FIG. 12, a first semiconductor material pattern 165 as shown in FIG. 9, instead of a first separation sidewall pattern 161, may be disposed between the gate separation pattern 160 and the first sheet patterns NS1 in certain embodiments.

Figure 13:
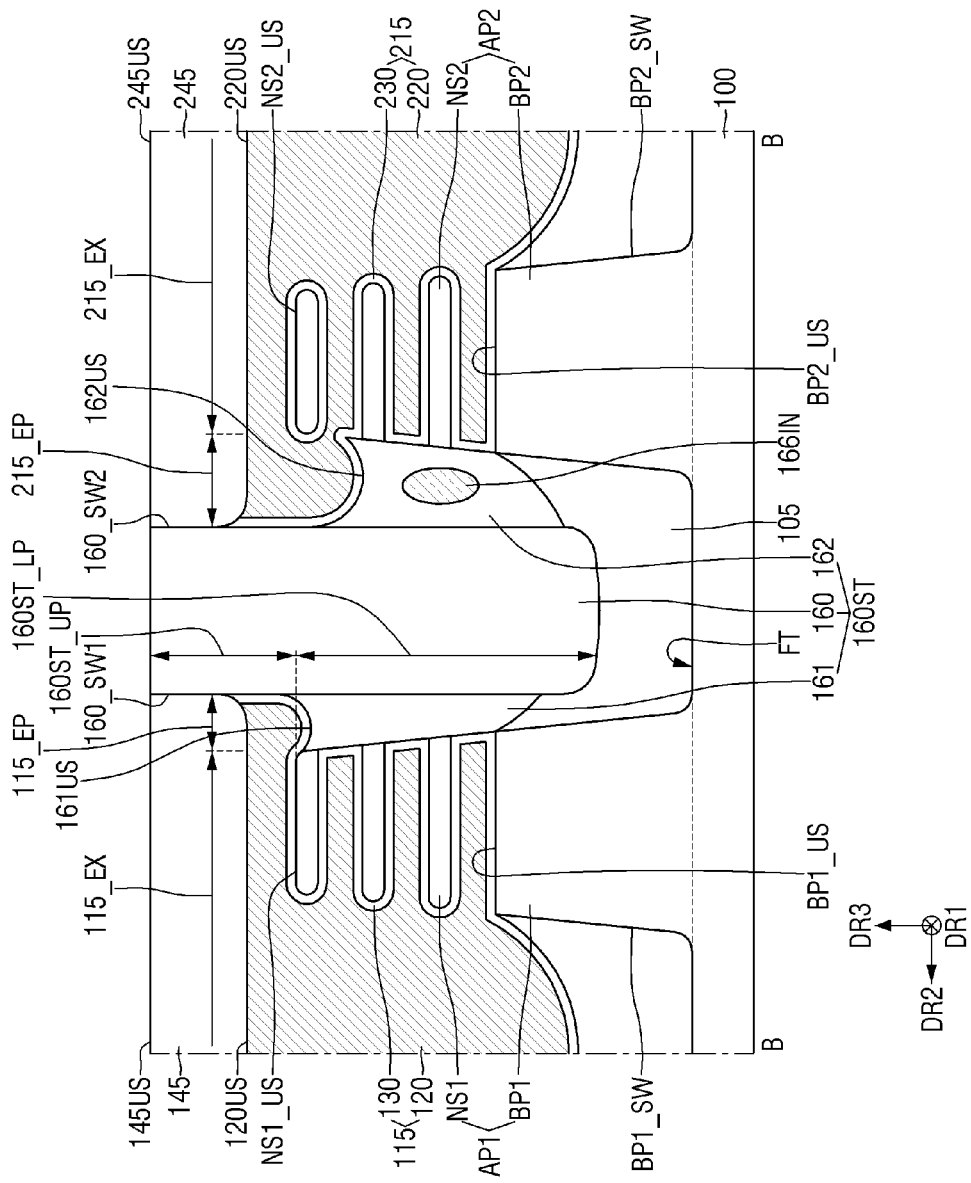
FIG. 13 is a cross-sectional view of a semiconductor device according to some embodiments of the present disclosure.

FIG. 13 is a cross-sectional view of a semiconductor device according to some embodiments of the present disclosure. The embodiment of FIG. 13 will hereinafter be described, focusing mainly on the differences from the embodiment of FIG. 11.

Referring to FIG. 13, the semiconductor device according to some embodiments of the present disclosure may further include a second inner semiconductor pattern 166IN, which is disposed in a second separation sidewall pattern 162.

The second separation sidewall pattern 162 may surround the second inner semiconductor pattern 166IN. In certain embodiments, a portion of the outer circumference of the second inner semiconductor pattern 166IN may not be covered by the second separation sidewall pattern 162.

Figure 14:
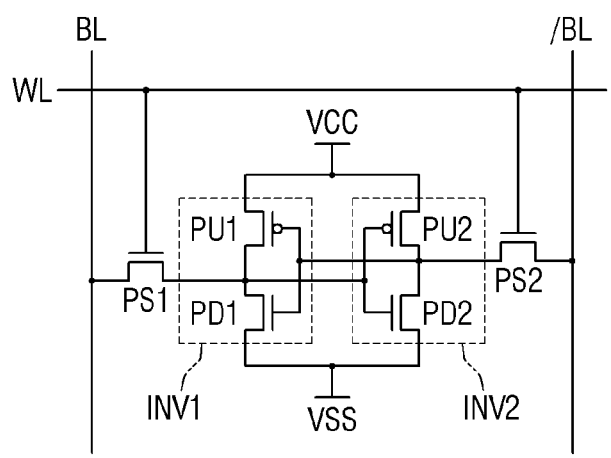
FIG. 14 is a circuit diagram of a semiconductor device according to some embodiments of the present disclosure.
Figure 15:
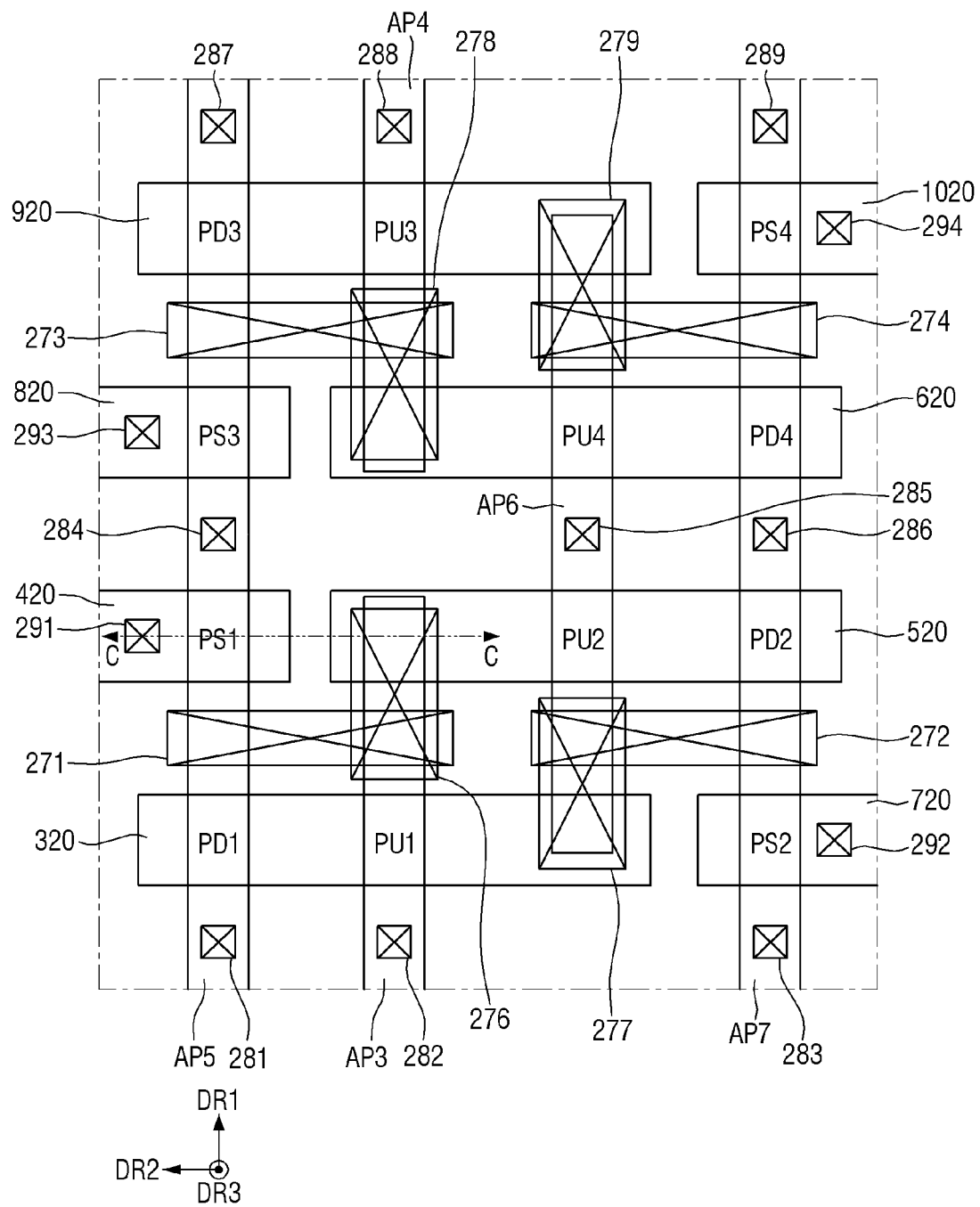
FIG. 15 is an extended layout view of the semiconductor device of FIG. 14.
Figure 16:
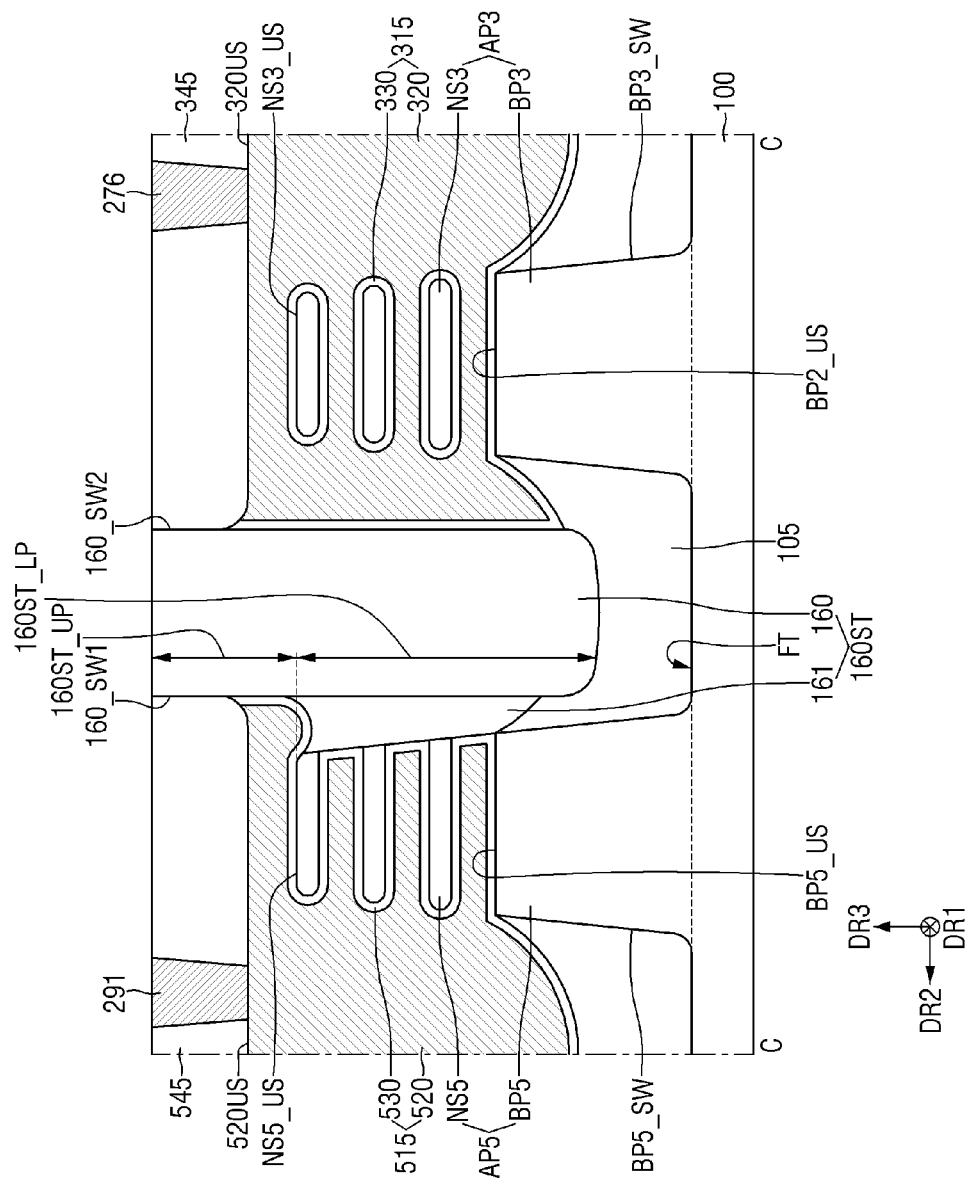
FIG. 16 is a cross-sectional view taken along line C-C of FIG. 15.

FIG. 14 is a circuit diagram of a semiconductor device according to some embodiments of the present disclosure. FIG. 15 is an extended layout view of the semiconductor device of FIG. 14. FIG. 16 is a cross-sectional view taken along line C-C of FIG. 15.

For example, FIG. 15 illustrates a layout where two pairs of inverters (INV1 and INV2) described with reference to FIG. 14 are arranged one after another. FIG. 15 does not illustrate wires included in a back-end-of-line (BEOL).

The semiconductor device of FIG. 16 may be the same as or similar to the semiconductor device of FIG. 8, but the present disclosure is not limited thereto. Alternatively, the cross-sectional view taken along line C-C of FIG. 15 may be the same as or similar to the semiconductor device of any one of FIGS. 4 through 7 and 9 through 13.

Referring to FIG. 14, the semiconductor device according to some embodiments of the present disclosure may include a pair of first inverter INV1 and second inverter INV2, which are connected in parallel between a power supply node VCC and a ground node VSS, and a first pass transistor PS1 and a second pass transistor PS2, which are electrically connected to the output nodes of each of the first inverter INV1 and the second inverter INV2.

The first pass transistor PS1 and the second transistor PS2 may be electrically connected to a bitline BL and a complementary bitline/BL, respectively. The gates of the first pass transistor PS1 and the second transistor PS2 may be electrically connected to a wordline WL.

The first inverter INV1 may include a first pull-up transistor PU1 and a first pull-down transistor PD1, which are connected in series between the power supply node VCC and the ground node VSS, and the second inverter INV2 may include a second pull-up transistor PU2 and a second pull-down transistor PD2, which are connected in series between the power supply node VCC and the ground node VSS.

The first pull-up transistor PU1 and the second pull-up transistor PU2 may be P-type transistors, and the first pull-down transistor PD1 and the second pull-down transistor PD2 may be N-type transistors.

To form a single latch circuit, the input node of the first inverter INV1 may be electrically connected to the output node of the second inverter INV2, and the input node of the second inverter INV2 may be electrically connected to the output node of the first inverter INV1.

Referring to FIGS. 15 and 16, the semiconductor device according to some embodiments of the present disclosure may include third to seventh active patterns AP3, AP4, AP5, AP6 and AP7, third to tenth gate electrodes 320, 420, 520, 620, 720, 820, 920, and 1020, a plurality of bridge contacts 271, 272, 273 and 274, a plurality of node contacts 276, 277, 288 and 279, a plurality of source/drain contacts 281, 282, 283, 284, 285, 286, 287, 288 and 289, and a plurality of gate contacts 291, 292, 293 and 294.

The active patterns AP3, AP4, AP5, AP6 and AP7 may be disposed in an SRAM region. The third active pattern AP3, the fourth active pattern AP4, and the sixth active pattern AP6 may be disposed in a PMOS region of an SRAM. The fifth active pattern AP5 and the seventh active pattern AP7 may be disposed in an NMOS region of an SRAM.

The active patterns AP3, AP4, AP5, AP6 and AP7 may protrude from a substrate 100. The active patterns AP3, AP4, AP5, AP6 and AP7, like the first active pattern AP1 and the second active pattern AP2 of FIGS. 1 through 4, may include lower patterns and sets of sheet patterns on the lower patterns. The active patterns AP3, AP4, AP5, AP6 and AP7 may be the same or substantially the same as the first active pattern AP1 and/or the second active pattern AP2.

The active patterns AP3, AP4, AP5, AP6 and AP7 may extend in a first direction DR1. The third active pattern AP3, the fourth active pattern AP4, and the sixth active pattern AP6 may be disposed between the fifth active pattern AP5 and the seventh active pattern AP7, which are spaced apart from each other in a second direction DR2.

The third active pattern AP3 and the fourth active pattern AP4 may be arranged along the first direction DR1. For example, the third active pattern AP3 and the fourth active pattern AP4 may extend parallel to the first direction DR1, and the third active pattern AP3 and the fourth active pattern AP4 may be disposed on the same straight line extending in the first direction DR1. The third active pattern AP3 and the fourth active pattern AP4 may be spaced apart from each other in the first direction DR1. The fifth active pattern AP5 may be spaced apart from the third active pattern AP3 and the fourth active pattern AP4 in the second direction DR2. The sixth active pattern AP6 may be spaced apart from the third active pattern AP3 and the fourth active pattern AP4 in the second direction DR2. The sixth active pattern AP6 may overlap with parts of the third active pattern AP3 and the fourth active pattern AP4 in the second direction DR2. The third active pattern AP3, the fourth active pattern AP4 and the sixth active pattern AP6 may be arranged in a zigzag fashion in the first direction DR1. The sixth active pattern AP6 may be spaced apart from the seventh active pattern AP7 in the second direction DR2.

The gate electrodes 320, 420, 520, 620, 720, 820, 920, and 1020 may extend in the second direction DR2. The third gate electrode 320 and the seventh gate electrode 720 may be arranged along the second direction DR2. For example, the third gate electrode 320 and the seventh gate electrode 720 may extend parallel to the second direction DR2, and the third gate electrode 320 and the seventh gate electrode 720 may be disposed on the same straight line extending in the second direction DR2. The third gate electrode 320 and the seventh gate electrode 720 may be spaced apart from each other in the second direction DR2. The fourth gate electrode 420 and the fifth gate electrode 520 may be arranged along the second direction DR2. The fourth gate electrode 420 and the fifth gate electrode 520 may be spaced apart from each other in the second direction DR2. The sixth gate electrode 620 and the eighth gate electrode 820 may be arranged along the second direction DR2. The sixth gate electrode 620 and the eighth gate electrode 820 may be spaced apart from each other in the second direction DR2. The ninth gate electrode 920 and the tenth gate electrode 1020 may be arranged along the second direction DR2. The ninth gate electrode 920 and the tenth gate electrode 1020 may be spaced apart from each other in the second direction DR2. The third gate electrode 320, the fifth gate electrode 520, the sixth gate electrode 620, and the ninth gate electrode 920 may be spaced apart from one another in the first direction DR1.

The third gate electrode 320, the fourth gate electrode 420, the eighth gate electrode 820 and the ninth gate electrode 920 may intersect the fifth active pattern AP5. The third gate electrode 320 may intersect the third active pattern AP3 and the sixth active pattern AP6. The ninth gate electrode 920 may intersect the fourth active pattern AP4 and the sixth active pattern AP6. The fifth gate electrode 520, the sixth gate electrode 620, the seventh gate electrode 720, and the tenth gate electrode 1020 may intersect the seventh active pattern AP7. The fifth gate electrode 520 may intersect the third active pattern AP3 and the sixth active pattern AP6. The sixth gate electrode 620 may intersect the fourth active pattern AP4 and the sixth active pattern AP6. The third gate electrode 320 and the ninth gate electrode 920 may intersect terminal parts of the sixth active pattern AP6. The fifth gate electrode 520 may intersect a terminal part of the third active pattern AP3. The sixth gate electrode 620 may intersect a terminal part of the fourth active pattern AP4.

The gate electrodes 320, 420, 520, 620, 720, 820, 920, and 1020 may be the same or substantially the same as the first gate electrode 120 and/or the second gate electrode 220 of FIGS. 1 through 4.

The first pull-up transistor PU1 may be defined in the intersection between the third gate electrode 320 and the third active pattern AP3, the first pull-down transistor PD1 may be defined in the intersection between the third gate electrode 320 and the fifth active pattern AP5, and the first pass transistor PS1 may be defined in the intersection between the fourth gate electrode 420 and the fifth active pattern AP5.

The second pull-up transistor PU2 may be defined in the intersection between the fifth gate electrode 520 and the sixth active pattern AP6, the second pull-down transistor PD2 may be defined in the intersection between the fifth gate electrode 520 and the seventh active pattern AP7, and the second pass transistor PS2 may be defined in the intersection between the seventh gate electrode 720 and the seventh active pattern AP7.

A third pull-up transistor PU3 may be defined in the intersection between the ninth gate electrode 920 and the fourth active pattern AP4, a third pull-down transistor PD3 may be defined in the intersection between the ninth gate electrode 920 and the fifth active pattern AP5, and a third pass transistor PS3 may be defined in the intersection between the eighth gate electrode 820 and the fifth active pattern AP5.

A fourth pull-up transistor PU4 may be defined in the intersection between the sixth gate electrode 620 and the sixth active pattern AP6, a fourth pull-down transistor PD4 may be defined in the intersection between the sixth gate electrode 620 and the seventh active pattern AP7, and a fourth pass transistor PS4 may be defined in the intersection between the tenth gate electrode 1020 and the seventh active pattern AP7.

The first pull-up transistor PU1 and the second pull-up transistor PU2, the first pull-down transistor PD1 and the second pull-down transistor PD2, and the first pass transistor PS1 and the second pass transistor PS2 may be included in a first SRAM cell. The third pull-up transistor PU3 and the fourth pull-up transistor PU4, the third pull-down transistor PD3 and the fourth pull-down transistor PD4, and the third pass transistor PS3 and the fourth pass transistor PS4 may be included in a second SRAM cell.

The first and second SRAM cells may be electrically connected to their respective bitlines BL and their respective complementary bitlines/BL.

FIG. 15 illustrates that a pull-down transistor or a pass transistor is defined in the intersection between a gate electrode and an active pattern, but the present disclosure is not limited thereto. Alternatively, a pull-down transistor or a pass transistor may be defined in the intersection between a gate electrode and more than one active pattern.

Each of the bridge contacts 271, 272, 273 and 274 may be a contact electrically connecting the source/drain region of a pull-up transistor, the source/drain region of a pull-down transistor, and the source/drain region of a pass transistor. As the bridge contacts 271, 272, 273 and 274 are electrically connected to source/drain regions, the bridge contacts 271, 272, 273 and 274 may be bridge source/drain contacts.

The first bridge contact 271 is electrically connected to the source/drain region of the first pull-up transistor PU1, the source/drain region of the first pull-down transistor PD1, and the source/drain region of the first pass transistor PS1. The first bridge contact 271 may be disposed between the third gate electrode 320 and the fourth gate electrode 420 and between the third gate electrode 320 and the fifth gate electrode 520. The second bridge contact 272 is electrically connected to the source/drain region of the second pull-up transistor PU2, the source/drain region of the second pull-down transistor PD2, and the source/drain region of the second pass transistor PS2. The second bridge contact 272 may be disposed between the third gate electrode 320 and the fifth gate electrode 520 and between the fifth gate electrode 520 and the seventh gate electrode 720. The third bridge contact 273 is electrically connected to the source/drain region of the third pull-up transistor PU3, the source/drain region of the third pull-down transistor PD3, and the source/drain region of the third pass transistor PS3. The third bridge contact 273 may be disposed between the sixth gate electrode 620 and the ninth gate electrode 920 and between the eighth gate electrode 820 and the ninth gate electrode 920. The fourth bridge contact 274 is electrically connected to the source/drain region of the fourth pull-up transistor PU4, the source/drain region of the fourth pull-down transistor PD4, and the source/drain region of the fourth pass transistor PS4. The fourth bridge contact 274 may be disposed between the sixth gate electrode 620 and the ninth gate electrode 920 and between the eighth gate electrode 820 and the tenth gate electrode 1020.

Each of the node contacts 276, 277, 278 and 279 may be a contact electrically connecting a corresponding one of the gates of a pull-up transistor and a pull-down transistor connected in series between a power source node VCC and a ground node VSS as shown in FIG. 14 to a corresponding one of the bridge contacts 271, 272, 273 and 274.

The first node contact 276 electrically connects the first bridge contact 271 to the fifth gate electrode 520. The fifth gate electrode 520 may correspond to the gates of the second pull-up transistor PU2 and the second pull-down transistor PD2. The second node contact 277 electrically connects the second bridge contact 272 to the third gate electrode 320. The third gate electrode 320 may correspond to the gates of the first pull-up transistor PU1 and the first pull-down transistor PD1. The third node contact 278 electrically connects the third bridge contact 273 to the sixth gate electrode 620. The sixth gate electrode 620 may correspond to the gates of the fourth pull-up transistor PU4 and the fourth pull-down transistor PD4. The fourth node contact 279 electrically connects the fourth bridge contact 274 to the ninth gate electrode 920. The ninth gate electrode 920 may correspond to the gates of the third pull-up transistor PU3 and the third pull-down transistor PD3.

Each of the plurality of the source/drain contacts 281, 282, 283, 284, 285, 286, 287, 288 and 289 may be a contact electrically connected to a power supply node VCC, a ground node VSS, a bitline BL, and/or a complementary bitline/BL as shown in FIG. 14.

Each of the plurality of the gate contacts 291, 292, 293 and 294 may be a contact electrically connected to a wordline WL as illustrated in FIG. 14.

Referring to FIG. 16, the third active pattern AP3 may include a third lower pattern BP3 and a plurality of third sheet patterns NS3. The third sheet patterns NS3 are disposed on an upper surface BP3_US of the third lower pattern BP3. The fifth active pattern AP5 may include a fifth lower pattern BP5 and a plurality of fifth sheet patterns NS5. The fifth sheet patterns NS5 are disposed on an upper surface BP5_US of the fifth lower pattern BP5.

An upper surface NS3_US may be the upper surface of the uppermost third sheet pattern NS3. An upper surface NS5_US may be the upper surface of the uppermost fifth sheet pattern NS5.

A field insulating film 105 may generally cover sidewalls BP3_SW of the third lower pattern BP3 and sidewalls BP5_SW of the fifth lower pattern BP5, which define a fin trench FT, but the present disclosure is not limited thereto.

A third gate structure 315 may be disposed on the third active pattern AP3 and may intersect the third active pattern AP3. The third gate structure 315 may be disposed on the third lower pattern BP3. The third gate structure 315 may intersect the third lower pattern BP3. The third gate structure 315 may surround the third sheet patterns NS3. The third gate structure 315 may include a third gate electrode 320 and third insulating films 330.

A fifth gate structure 515 may be disposed on the fifth active pattern AP5 and may intersect the fifth active pattern AP5. The fifth gate structure 515 is disposed on the fifth lower pattern BP5. The fifth gate structure 515 may intersect the fifth lower pattern BP5. The fifth gate structure 515 may surround at least one of the fifth sheet patterns NS5. The fifth gate structure 515 includes a fifth gate electrode 520 and a fifth gate insulating film 530.

A third gate capping pattern 345 extends along and/or contacts an upper surface 320US of the third gate electrode

320. A fifth gate capping pattern 545 extends along and/or contacts an upper surface 520US of the fifth gate electrode 520.

A gate separation structure 160ST may include a gate separation pattern 160 and a first separation sidewall pattern 161. The first separation sidewall pattern 161 may be disposed between the gate separation pattern 160 and the fifth sheet patterns NS5.

The gate separation structure 160ST may be divided into and/or may include an upper part 160ST_UP and a lower part 160ST_LP based on the upper surface NS3_US of the uppermost third sheet pattern NS3 or the upper surface NS5_US of the uppermost fifth sheet pattern NS5. For example, a vertical level of the upper surface NS3_US of the uppermost third sheet pattern NS3 and/or the upper surface NS5_US of the uppermost fifth sheet pattern NS5 may be a fiducial/reference level to divide the gate separation structure 160ST into the upper and lower parts 160ST_UP and 160ST_LP. For example, the upper part 160ST_UP may be a part of the gate separation structure 160ST above the fiducial/reference level, the lower part 160ST_LP may be the other part of the gate separation structure 160ST which is below the fiducial/reference level.

The gate separation pattern 160 is illustrated as being closer to the fifth sheet patterns NS5 than to the third sheet patterns NS3, but the present disclosure is not limited thereto. Alternatively, the gate separation pattern 160 may be closer to the third sheet patterns NS3 than to the fifth sheet patterns NS5, in which case, the first separation sidewall pattern 161 may be disposed between the gate separation pattern 160 and the third sheet patterns NS3.

The third active pattern AP3, the fifth active pattern AP5, the third gate structure 315, the fifth gate structure 515, and the gate separation structure 160ST may be the same or substantially the same as the first active pattern AP1, the second active pattern AP2, the first gate structure 115, the second gate structure 215, and the gate separation structure 160ST, respectively, of FIGS. 1 through 4 or FIG. 8.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
   a first active pattern on a substrate, the first active pattern including a first lower pattern, which extends in a first direction, and first sheet patterns, which are on the first lower pattern;
   a second active pattern on the substrate, the second active pattern including a second lower pattern, which is spaced apart from the first lower pattern in a second direction and a second sheet patterns, which are on the second lower pattern, wherein the first lower pattern and the second lower pattern is separated by a fin trench;
   a field insulating film disposed between the first and second lower patterns, the field insulating film being in contact with the first and second lower patterns;
   a first gate structure on the substrate, the first gate structure intersecting the first active pattern;
   a second gate structure on the substrate, the second gate structure intersecting the second active pattern; and
   a gate separation pattern disposed on the field insulating film, the gate separation pattern being in contact with the first gate structure and second gate structure,
   wherein
   the first gate structure includes a first terminal region, which is disposed between the first active pattern and the gate separation pattern,
   the second gate structure includes a second terminal region, which is disposed between the second active pattern and the gate separation pattern,
   a distance between the gate separation pattern and the first sheet patterns is less than a distance between the gate separation pattern and the second sheet patterns, and
   a first height from a vertical level of a bottom surface of the fin trench to a lowermost part of the first terminal region is greater than a second height from the vertical level of the bottom surface of the fin trench to a lowermost part of the second terminal region.

2. The semiconductor device of claim 1, wherein the first height is greater than a third height,
   the third height is a height from the vertical level of the bottom surface of the fin trench to an upper surface of the first lower pattern.

3. The semiconductor device of claim 2, wherein the second height is greater than the third height.

4. The semiconductor device of claim 1, further comprising:
   a first separation sidewall pattern disposed between the gate separation pattern and the first sheet patterns,
   wherein
   the first separation sidewall pattern covers a portion of a sidewall of the gate separation pattern, and
   the first gate structure covers an upper surface of the first separation sidewall pattern and is in contact with the upper surface of the first separation sidewall pattern.

5. The semiconductor device of claim 4, further comprising:
   a second separation sidewall pattern disposed between the gate separation pattern and the second sheet patterns,
   wherein the second separation sidewall pattern covers a portion of a sidewall of the gate separation pattern.

6. The semiconductor device of claim 5, wherein
   the second gate structure further includes a gate insulating film,
   the second sheet patterns include a lower second sheet pattern and an upper second sheet pattern on the lower second sheet pattern, and
   the gate insulating film surrounds the upper second sheet pattern and does not surround the lower second sheet pattern.

7. The semiconductor device of claim 4, wherein the first separation sidewall pattern is in contact with the first sheet patterns.

8. The semiconductor device of claim 4, wherein the upper surface of the first separation sidewall pattern is lower than an upper surface of the first sheet patterns.

9. The semiconductor device of claim 1, wherein
   the first gate structure surrounds the first sheet patterns, and
   the second gate structure surrounds the second sheet patterns.

10. The semiconductor device of claim 1, wherein
    the first gate structure includes a gate insulating film and a gate electrode on the gate insulating film, and
    the gate insulating film extends along a sidewall of the gate separation pattern.

11. The semiconductor device of claim 1, wherein
the first gate structure includes a gate insulating film and a gate electrode on the gate insulating film, and
the gate insulating film does not extend along a sidewall of the gate separation pattern.

12. The semiconductor device of claim 1, further comprising:
a semiconductor material pattern disposed between the gate separation pattern and the first sheet patterns, wherein
the semiconductor material pattern covers a portion of a sidewall of the gate separation pattern, and
an upper surface of the semiconductor material pattern is lower than an upper surface of the first sheet patterns.

13. A semiconductor device comprising:
a first active pattern on a substrate, the first active pattern including a first lower pattern, which extends in a first direction, and first sheet patterns, which are on the first lower pattern;
a second active pattern on the substrate, the second active pattern including a second lower pattern, which is spaced apart from the first lower pattern in a second direction, and second sheet patterns, which are on the second lower pattern;
a field insulating film disposed between the first lower pattern and the second lower pattern, the field insulating film being in contact with the first lower pattern and the second lower pattern;
a first gate structure on the substrate, the first gate structure intersecting the first active pattern;
a second gate structure on the substrate, the second gate structure intersecting the second active pattern;
a gate separation pattern disposed on the field insulating film, the gate separation pattern including a first sidewall, which faces the first sheet patterns, and a second sidewall, which faces the second sheet patterns; and
a first separation sidewall pattern disposed on a portion of the first sidewall of the gate separation pattern,
wherein an upper surface of the first separation sidewall pattern is lower than an upper surface of the first sheet patterns based on an upper surface of the first lower pattern.

14. The semiconductor device of claim 13, wherein a first distance between the gate separation pattern and the first sheet patterns is less than a second distance between the gate separation pattern and the second sheet patterns.

15. The semiconductor device of claim 13, wherein the first gate structure covers the upper surface of the first separation sidewall pattern and is in contact with the first sidewall of the gate separation pattern.

16. The semiconductor device of claim 13, wherein the second gate structure includes a gate insulating film, which surrounds the second sheet patterns, and a gate electrode, which is on the gate insulating film.

17. The semiconductor device of claim 13, further comprising:
a second separation sidewall pattern disposed on a portion of the second sidewall of the gate separation pattern, the second separation sidewall pattern being in contact with the second sheet patterns.

18. The semiconductor device of claim 17, wherein a thickness, in the second direction, of the first separation sidewall pattern differs from a thickness, in the second direction, of the second separation sidewall pattern.

19. A semiconductor device comprising:
a first active pattern on a substrate, the first active pattern including a first lower pattern extending in a first direction and first sheet patterns on the first lower pattern;
a second active pattern on the substrate, the second active pattern including a second lower pattern spaced apart from the first lower pattern in a second direction and second sheet patterns on the second lower pattern;
a field insulating film disposed between the first lower pattern and the second lower pattern, the field insulating film being in contact with the first lower pattern and the second lower pattern;
a first gate structure on the substrate, the first gate structure intersecting the first active pattern and including a first gate insulating film and a first gate electrode;
a second gate structure on the substrate, the second gate structure intersecting the second active pattern and including a second gate insulating film and a second gate electrode; and
a gate separation structure disposed on the field insulating film, the gate separation structure being in contact with the first sheet patterns and the second sheet patterns,
wherein
the gate separation structure includes a lower part, which is disposed below an upper surface of the first sheet patterns, and an upper part, which is disposed above the upper surface of the first sheet patterns,
the first gate structure and the second gate structure are in contact with sidewalls of the upper part of the gate separation structure,
the first gate insulating film and the second gate insulating film extend along the sidewalls of the upper part of the gate separation structure, and
a distance, in the second direction, between the upper part of the gate separation structure and the first sheet patterns is less than a distance, in the second direction, between the upper part of the gate separation structure and the second sheet patterns.

20. The semiconductor device of claim 19, wherein
the gate separation structure includes a gate separation pattern, a first separation sidewall pattern, and a second separation sidewall pattern,
the gate separation structure has a first sidewall, which faces the first sheet patterns, and a second sidewall, which faces the second sheet patterns,
the first separation sidewall pattern is disposed on part of the first sidewall of the gate separation pattern, and
the second separation sidewall pattern is disposed on part of the second sidewall of the gate separation pattern.

* * * * *